(12) United States Patent
Menezo et al.

(10) Patent No.: US 11,495,938 B2
(45) Date of Patent: Nov. 8, 2022

(54) HYBRID SEMICONDUCTOR LASER COMPONENT AND METHOD FOR MANUFACTURING SUCH A COMPONENT

(71) Applicant: COMMISSARIAT À L'ÉNERGIE ATOMIQUE ET AUX ÉNERGIES ALTERNATIVES, Paris (FR)

(72) Inventors: Sylvie Menezo, Voiron (FR); Olivier Girard, Saint Egreve (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 437 days.

(21) Appl. No.: 16/622,571

(22) PCT Filed: Jun. 18, 2018

(86) PCT No.: PCT/FR2018/051446
§ 371 (c)(1),
(2) Date: Dec. 13, 2019

(87) PCT Pub. No.: WO2018/234673
PCT Pub. Date: Dec. 27, 2018

(65) Prior Publication Data
US 2021/0151950 A1 May 20, 2021

(30) Foreign Application Priority Data
Jun. 19, 2017 (FR) ...................... 1755575

(51) Int. Cl.
*H01S 5/024* (2006.01)
*H01S 5/026* (2006.01)
(Continued)

(52) U.S. Cl.
CPC ........ *H01S 5/02469* (2013.01); *H01S 3/2375* (2013.01); *H01S 5/021* (2013.01);
(Continued)

(58) Field of Classification Search
CPC .... H01S 5/02469; H01S 3/2375; H01S 5/021; H01S 5/0261; H01S 5/1032
See application file for complete search history.

(56) References Cited

U.S. PATENT DOCUMENTS 7,257,283 B1 * 8/2007 Liu .................... G02B 6/12004
385/24
2008/0002929 A1 1/2008 Bowers et al.
(Continued)

FOREIGN PATENT DOCUMENTS

EP 2866316 A1 4/2015

OTHER PUBLICATIONS

Search Report for French application No. 1755575 dated Mar. 23, 2018.
(Continued)

*Primary Examiner* — Yuanda Zhang
(74) *Attorney, Agent, or Firm* — Pearne & Gordon LLP

(57) ABSTRACT

A hybrid semiconductor laser component comprising at least one first emitting module comprising an active zone shaped to emit electromagnetic radiation at a given wavelength; and an optical layer comprising at least one first waveguide optically coupled with the active zone, the waveguide forming with the active zone an optical cavity resonating at the given wavelength. The hybrid semiconductor laser component also comprises a heat-dissipating semiconductor layer, the heat-dissipating semiconductor layer being in thermal contact with the first emitting module on a surface of the first emitting module that is opposite the optical layer. The invention also relates to a method for manufacturing such a hybrid semiconductor laser component.

19 Claims, 19 Drawing Sheets

(51) Int. Cl.
*H01S 3/23* (2006.01)
*H01S 5/02* (2006.01)
*H01S 5/10* (2021.01)

(52) U.S. Cl.
CPC .......... *H01S 5/0261* (2013.01); *H01S 5/1032* (2013.01); *H01S 2301/176* (2013.01)

(56) References Cited

U.S. PATENT DOCUMENTS

| | | | |
|---|---|---|---|
| 2014/0177994 A1* | 6/2014 | Chen | H01L 31/105 438/69 |
| 2016/0164613 A1 | 6/2016 | Menezo et al. | |
| 2016/0299292 A1 | 10/2016 | Hassan et al. | |
| 2017/0237229 A1* | 8/2017 | Menezo | H01S 5/02325 385/3 |
| 2018/0212399 A1 | 7/2018 | Menezo et al. | |
| 2019/0094467 A1 | 3/2019 | Hassan et al. | |
| 2019/0170937 A1 | 6/2019 | Menezo et al. | |
| 2019/0243064 A1 | 8/2019 | Menezo et al. | |
| 2019/0280461 A1 | 9/2019 | Menezo et al. | |

OTHER PUBLICATIONS

International Search Report for PCT/FR2018/051446 dated Sep. 26, 2018.
Written Opinion for PCT/FR2018/051446 dated Sep. 26, 2018.
Zhang, Chong et al. "Thermal Management of Hybrid Silicon Ring Lasers for High Temperature Operation" In: IEEE Journal of Selected Topics in Quantum Electronics, Nov. 1, 2015, vol. 21, No. 6, pp. 1-7.
Mathews, Ian et al. "Towards AlN optical classing layers for thermal management in hybrid lasers" IN: Visual Communication and Image Processing, Jun. 1, 2015, vol. 9520, pp. 95200J1-10.
Fang, Alexander W. et al. "A distributed feedback silicon evanescent laser" In: Optics Express, Mar. 31, 2008, vol. 16, Nol 7, pp. 4413-4419.
Bakir, Ben B. et al. "Electrically driven hybrid Si/III-V Fabry-Perot lasers based on adiabatic mode transformers" In Optics Express, May 23, 2011, vol. 19, No. 11, pp. 10317-10325.
Sysak, Matthew N. et al. "Reduction of hybrid silicon laser thermal impedance using Poly Si thermal shunts" In: Optical Fiber Communication Conference and Exposition and the National Fiber Optic Engineers Conference 2011.
Creazzo, Timothy et al. "Integrated tunable CMOS laser" In: Optics Express, Nov. 18, 2013, vol. 21, No. 23, pp. 28048-28053.
Beilliard, Yann et al., 3D Systems Integration Conference 2013 "Chip to wafer copper direct bonding electrical characterization and thermal cycling", In: IEEE 2013.

* cited by examiner

HYBRID SEMICONDUCTOR LASER COMPONENT AND METHOD FOR MANUFACTURING SUCH A COMPONENT

CROSS-REFERENCE TO RELATED APPLICATIONS

This is a National Stage application of PCT international application PCT/FR2018/051446, filed on Jun. 18, 2018, which claims the priority of French Patent Application No. 17 55575, filed Jun. 19, 2017, both of which are incorporated herein by reference in their entireties.

TECHNICAL FIELD

The invention relates to the field of electronics and optoelectronics and more particularly relates to hybrid semiconductor laser components.

Thus, one object of the invention is a hybrid semiconductor laser component and a method for manufacturing such a component.

STATE OF PRIOR ART

In order to enable integration of laser components on semiconductor supports or photonic systems which are not adapted, such as silicon supports or silicon-based photonic systems, it is known to use hybrid semiconductor laser components.

In order to exemplify this type of hybrid semiconductor laser components, it is referred to the works by A. W. FANG et al. which have been published on 31 Mar. 2008 in the scientific journal Optics Express volume 16 number 7 pages 4413-4419 which relate to a hybrid semiconductor laser based on an adiabatic optical coupling by mode transformation between an emission module and a wave guide, and to the works by B. BEN BAKIR et al. which have been published in 2011 in the scientific journal Optics Express volume 19 number 11 pages 4413-4419 which relate to a hybrid semiconductor laser based on an evanescent optical coupling between an emission module and a wave guide.

Such components generally include:
- an emission module comprising an active zone made of direct-gap semiconductor materials, such as semiconductors III-V, and shaped to emit an electromagnetic radiation at a given wavelength,
- an optical layer comprising at least one wave guide optically coupled to the active zone, the wave guide forming with the active zone an optical cavity resonating at the given wavelength.

This optical layer is generally provided by means of a semiconducting on insulator layer, such as a silicon-on-insulator layer of a SOI substrate (generally of SiO2). With such a substrate, the insulator layer is laid on a silicon support. This insulating layer of the SOI substrate brings about a thermal insulation between the optical layer and the silicon support, which is poorly suited to the removal of heat produced by the emission module to the silicon substrate. But, the performance of the emission module is strongly degraded with temperature, and stops operating at temperatures higher than 70° C.

Thus, if this type of component allows the integration of laser components on unsuitable photonic supports or systems such as silicon supports, it has the drawback of having an insufficient heat-dissipating.

In order to overcome this problem, M. SYSTAK and Co. have suggested, within the scope of their works presented in 2011 in the conference "Optical Fiber Communication Conference and Exposition and the National Fiber Optic Engineers Conference", to provide amorphous silicon bridges between the silicon support and the silicon wave guide (in order to directly connect through the insulating layer). Such bridges can be integrated in apertures provided in the optical layer and the insulating layer without any interaction with the wave guide.

If M. SYSTAK and Co. have observed an improvement with respect to the operating temperature of the emission module, this improvement remains insufficient and the hybrid laser component has still degraded performance.

T. GREAZZO and Co. have in turn suggested within the scope of their works published in 2013 in the scientific journal "Optics Express", Volume 21 number 23 pages 28048-28053, to integrate the emission module in an aperture of the optical layer and the insulating layer such that the optical module is in direct thermal contact with the silicon support. In such a configuration, the heat produced by the emission module upon operating the hybrid laser is removed by the support.

If this configuration suggested by T. GREAZZO and Co. enables the operating temperature to be improved, it has however a major drawback. Indeed, since the emission module is placed in an aperture of the optical layer and the insulator layer, the coupling between the wave guide, being located in the optical layer, and the emission module is necessarily an end-to-end coupling. For this reason, such a configuration is not compatible with other coupling types between the emission module and the wave guide, such as mode transformation couplings and evanescent couplings.

Finally, it will be noted that the solutions suggested by M. SYSTAK and T. GREAZZO and Co. require that the optical layer is itself supported by a semiconductor support. But, some photonic systems do not include a semiconductor support and have an optical layer the components and interconnections of which are fully encapsulated in an insulating material.

It will be noted that the ST™ Company has also developed a solution for the purpose of preserving the performances of the hybrid laser components of the same type as those described by A. W. FANG and Co. This solution consists in integrating on a face of the component, that which surrounds, with the optical layer, the emission module, a radiator facing the emission module. According to this solution, a metal interconnection between the emission module and the radiator enables a thermal bridge to be provided therebetween.

However, if such a solution enables the operating temperature of the module to be lowered, this lowering is however not sufficient to allow an optimised operation of the component. Indeed, with the solution provided by ST™, the face of the component comprising the radiator has also the control electronics of the component, which limits radiator dimensioning and thus the heat removal capability thereof. Thus, there is no satisfactory solution to provide a hybrid laser component having preserved performance, whatever the type of optical coupling between the wave guide and the emission module, in particular for mode transformation optical couplings and evanescent optical couplings. There is neither a satisfactory solution to provide a hybrid laser component having preserved performance in the event that the optical layer does not include a semiconductor support.

DISCLOSURE OF THE INVENTION

The invention aims at solving these drawbacks and thus its first purpose is to provide a hybrid laser component having preserved performance without disturbing the connexion of the component to a control electronics, and wherein the optical coupling between the emission module and the wave guide can be a mode transformation or evanescent optical coupling.

Another purpose of the invention is to provide a hybrid laser component having preserved performance, even in the event that the optical layer is not in contact with a semiconductor support.

To that end, the invention relates to a hybrid semiconductor laser component including:
- at least one first emission module comprising an active zone made of direct-gap semiconductor materials, such as semiconductors III-V, and shaped to emit an electromagnetic radiation at a first given wavelength,
- an optical layer comprising at least one first wave guide optically coupled to the active zone, the first wave guide forming with the active zone an optical cavity resonating at the given wavelength, the hybrid semiconductor laser component further including:
- a semiconducting layer, called heat-dissipating semiconducting layer, said heat-dissipating semiconducting layer being in thermal contact with the first emission module on a surface of the first emission module which is opposite to the optical layer, and
- at least one first interconnection to connect the at least first emission module, said first interconnection passing through the optical layer. In this way, upon operating the hybrid semiconductor laser, the heat emitted by the emission module can be removed by the surface of the first emission module opposite to the optical layer, without any requirement on the other surfaces of the emission module. Thus, the surfaces of the first emission module which are either facing each other, or transversal, of the optical layer, have no requirement as regards their configuration and are accessible to provide the optical coupling between the first emission module and the optical layer.

Such a laser component thus allows an optical coupling between the wave guide and the first emission module by the surface of the emission module facing the optical layer, by an evanescent coupling or by mode transformation coupling, while having preserved performance, since the heat generated can be removed by the heat-dissipating semiconducting layer.

Moreover, this heat-dissipating is provided by a semiconducting layer which is distinct from a possible support of the optical layer. This type of hybrid laser component is thus perfectly compatible with photonic systems not including a semiconductor support.

It will also be noted that the use of at least one interconnection to connect the first emission module which passes through the optical layer enables an offset of the control electronics opposite to the dissipation layer. Thus, it is possible to thermally optimise the operating performance of the component without interfering on the connection of the component to a control electronics.

By "heat-dissipating semiconducting layer in thermal contact with the first emission module on a surface of the first emission module which is opposite to the optical layer", it should be understood above and in the rest of this document that the thermal resistance between the surface of the first emission module and the semiconducting layer is lower than $1 \cdot 10^{-7}$ m$^2 \cdot$K$\cdot$W$^{-1}$, preferentially lower than $5 \cdot 10^{-8}$ m$^2 \cdot$K$\cdot$W$^{-1}$ and still more advantageously lower than $3 \cdot 10^{-8}$ m$^2 \cdot$K$\cdot$W$^{-1}$, or even $2 \cdot 10^{-8}$ m$^2 \cdot$K$\cdot$W$^{-1}$. Thus, the thermal contact between the heat-dissipating semiconducting layer and the surface of the first module which is opposite to the optical layer can be achieved by a direct contact between the same or through an interface layer having a reduced thermal resistance.

In accordance with this definition, with such a thermal contact, if there is a first laser module having a contact surface of 1 mm per 5 μm and a power of 0.1 W to be dissipated, a thermal resistance of $1 \cdot 10^{-2}$ m$^2 \cdot$K$\cdot$W$^{-1}$ corresponds to a temperature difference of 3.33° C. between the surface of the module and the surface of the heat-dissipating semiconducting layer. This temperature difference switches from 1.66° C. and 0.66° C. respectively for a thermal resistance of $5 \cdot 10^{-8}$ m$^2 \cdot$K$\cdot$W$^{-1}$ and $1 \cdot 10^{-7}$ m$^2 \cdot$K$\cdot$W$^{-1}$.

The emission module can comprise:
- a first semiconducting zone of a first conductivity type, the active zone in contact with the first semiconducting zone,
- a third semiconducting zone of a second conductivity type and being in contact with the active zone, the emission module being polarised through the first and third semiconducting zones, wherein the third semiconducting zone is in contact with the first interconnection, the emission module being in thermal contact with the heat-dissipating semiconducting layer by means of the first semiconducting zone.

The heat-dissipating semiconducting layer can extend on either side of the emission module.

The heat-dissipating semiconducting layer can be in electrical contact with the third semiconducting zone and includes a metal contact in order to enable a polarisation of the emission module.

The third semiconducting zone can be in thermal contact with the heat-dissipating semiconducting layer through at least one metal layer from which at least one second interconnection passing through the optical layer extends, said metal layer being electrically insulated from the heat-dissipating semiconducting layer.

The hybrid semiconductor laser component can further comprise a second interconnection to connect the at least one first emission module, the second interconnection being in electrical contact with the heat-dissipating semiconducting layer.

In this manner, the heat-dissipating semiconducting layer can form a common contact for all the emission modules, such as a ground and/or a contact P of the emission modules.

The hybrid semiconductor laser component can further comprise a second interconnection to connect the at least one first emission module, said second interconnection passing through the optical layer, said second interconnection preferentially comprising:
- a first interconnection portion extending towards the heat-dissipating layer,
- a metal layer portion extending substantially parallel to the heat-dissipating semiconducting layer, said portion being in electrical contact with the first interconnection portion,
- a second interconnection portion extending in a direction opposite to the heat-dissipating layer and passing through the optical layer, said second interconnection portion being in electrical contact with the metal layer portion.

In this way, all the contacts to connect the emission module can be provided on a face of the component which is opposite to the heat-dissipating semiconducting layer.

The hybrid semiconductor laser component can further comprise:
- at least one active component, such as an optical modulator, said active component being housed in the optical layer,
- at least one third interconnection to connect the active component, said third interconnection extending between the active component and a face of the laser component which is opposite to the heat-dissipating semiconducting layer.

The component can further comprise at least one fourth interconnection, called through fourth interconnection, said fourth interconnection extending between a face of the hybrid semiconductor laser component which is opposite to the heat-dissipating semiconducting layer and a face of the heat-dissipating semiconducting layer which is opposite to the optical layer, and said fourth interconnection can have on each of said face of the hybrid semiconductor laser component and said face of the semiconducting layer, a respective contact bump.

In this way, it is possible to provide, from this at least one fourth interconnection, an outer connection for a control electronics assembled to the face of the component which is opposite to the heat-dissipating semiconducting layer.

The heat-dissipating semiconducting layer can be a silicon layer.

Such a heat-dissipating layer makes it possible to benefit from the crystallographic quality and high doping capabilities permitted by silicon. It is thus possible to choose the characteristics of the heat-dissipating semiconducting layer adapted to dissipate the thermal energy transmitted by the first emission module.

The hybrid semiconductor laser component can further include at least one first metal layer in contact with the heat-dissipating semiconducting layer on a face of the heat-dissipating semiconducting layer which is opposite to the first emission module.

Such a first metal layer enables part of the thermal energy stored by the heat-dissipating semiconducting layer to be dissipated thus improving, de facto, the heat-dissipating capability of said semiconducting layer. It will be further noted that such a metal layer can also be used as a ground contact in the event that the heat-dissipating semiconducting layer is in electrical contact with the surface of the first emission module.

The hybrid semiconductor laser component can further comprise at least one second metal layer in electrical contact with the first emission module on the face of the first emission module which is opposite to the optical layer, the second metal layer participating in the thermal contact between the heat-dissipating semiconducting layer and the first emission module.

Such a second metal layer allows a proper thermal contact to be provided between the surface of the at least one emission module and the heat-dissipating semiconducting layer. In addition, such a second metal layer can advantageously allow, during the manufacturing method of such a component, a molecular bonding of the heat-dissipating semiconducting layer comprising said second metal layer on a third metal layer previously formed in contact with the surface of the first emission module.

The heat-dissipating semiconducting layer can be in electrical contact with the second metal layer.

In this way, the heat-dissipating layer can also form a ground contact for the first emission module.

Between the second metal layer and the heat-dissipating semiconducting layer, there can be provided at least one electrically insulating layer shaped to electrically insulate the second metal layer from the heat-dissipating semiconducting layer, the electrically insulating layer participating in the thermal contact between the heat-dissipating semiconducting layer and the first emission module.

Since the heat-dissipating semiconducting layer is electrically insulated from the first module, it is possible to use an individual interconnection for the first emission module. Thus, in the event that the hybrid semiconductor laser component includes at least one emission module other than the first emission module, the first and the other emission module are insulated from each other and can be independently supplied from each other.

The first emission module can be included in an encapsulation layer made of an insulator material, such as silicon nitride or silicon dioxide.

The hybrid semiconductor laser component can further comprise at least one second emission module comprising an active zone made of direct-gap semiconductor materials, such as semiconductors III-V, and shaped to emit an electromagnetic radiation at a second given wavelength different from or identical to the first given wavelength, the optical layer further comprising at least one second wave guide optically coupled to the active zone of the second emission module, said first wave guide forming with the active zone an optical cavity resonating at the second given wavelength, the heat-dissipating semiconducting layer being in thermal contact with the second emission module on a surface of the second emission module which is opposite to the optical layer.

Such a component benefits from the possibility of the invention according to which the invention is compatible with the common manufacturing methods of microelectronics and optoelectronics.

The invention further relates to a method for manufacturing a hybrid semiconductor laser, including the following steps of:
- providing an optical layer including at least one first wave guide,
- providing at least one first emission module comprising an active zone made of direct-gap semiconductor materials, such as semiconductors III-V, and shaped to emit an electromagnetic radiation at a first given wavelength, the active zone being optically coupled with the first wave guide and forming with the first wave guide an optical cavity resonating at the given wavelength,
- providing a semiconducting layer, called heat-dissipating semiconducting layer, said heat-dissipating semiconducting layer being in thermal contact with the first emission module on a surface of the first emission module which is opposite to the optical layer.

A step of forming at least one first interconnection to connect the at least first emission module can be also provided, said first interconnection extending by passing through the optical layer.

Such a method allows the formation of a hybrid semiconductor laser component according to the invention and thus to benefit from the advantages related thereto.

The step of providing a heat-dissipating semiconducting layer can comprise the following sub-steps of:
- forming at least one second metal layer in thermal contact with the first emission module on the surface of the first emission module which is opposite to the optical layer,
- providing the heat-dissipating semiconducting layer,
- forming a third metal layer in thermal contact with the heat-dissipating semiconducting layer, performing a metal molecular bonding of the second metal layer with the third metal layer so as to put the surface of the first emission module which is opposite to the optical layer and the heat-dissipating semiconducting layer into thermal contact.

Such a method enables a hybrid laser component to be provided the thermal contact of which between the heat-dissipating semiconducting layer and the surface of the at least one emission module is optimised since it is achieved by means of two metal layers.

During the step of providing a heat-dissipating semiconducting layer, between the sub-step of providing the heat-dissipating semiconducting layer and the sub-step of forming the third metal layer, the following sub-step can be provided forming at least one electrically insulating layer in thermal contact with the heat-dissipating semiconducting layer, the electrically insulating layer being shaped to electrically insulate the second metal layer of the heat-dissipating semiconducting layer, the electrically insulating layer participating in the thermal contact between the heat-dissipating semiconducting layer and the first emission module.

Such a method allows the formation of a hybrid semiconductor laser component including a thermal and electrical contact between the heat-dissipating semiconducting layer provided in particular by the electrically insulating layer according to the invention and to benefit from the advantages related to such a component.

During the step of providing the optical layer, the optical layer can include at least one second wave guide, during the step of providing the at least one first emission module, a second emission module can also be provided, the second emission module comprising an active zone made of direct-gap semiconductor materials, such as semiconductors III-V, and shaped to emit an electromagnetic radiation at a second given wavelength different from or identical to the first given wavelength, during the step of providing the heat-dissipating semiconducting layer, said heat-dissipating semiconducting layer being also in thermal contact with the second emission module on a surface of the second emission module which is opposite to the optical layer.

Such a method enables to benefit from the common manufacturing capabilities offered by microelectrics and optoelectronics and thus to manufacture a component including several emission modules and thus several hybrid semiconductor lasers.

BRIEF DESCRIPTION OF THE DRAWINGS

The present invention will be better understood upon reading the description of exemplary embodiments, given by way of purely indicating and in no way limiting purposes, in reference to the appended drawings in which.

Figure 1:
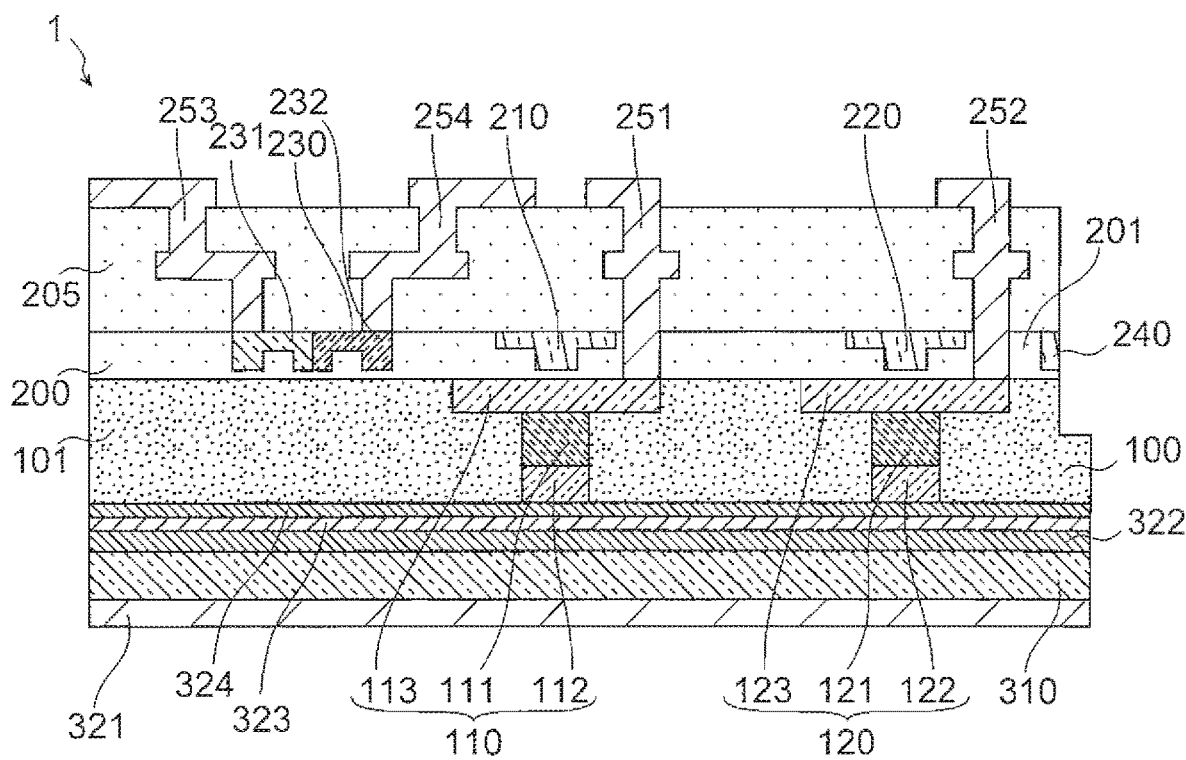
FIG. 1 is a schematic longitudinal cross-section view of a hybrid semiconductor laser component according to a first embodiment of the invention.

It will be noted that in all the longitudinal cross-section views of FIGS. 1 to 4N, the cross-section is made along a direction perpendicular to the direction of propagation of light in the wave guides and laser cavities.

Identical, similar or equivalent parts of the different figures bear the same reference numerals so as to facilitate switching from one figure to the other.

The different parts represented on the figures are not necessarily drawn to a uniform scale, to make the figures more readable.

The different possibilities (alternatives and embodiments) should be understood as being non-exclusive to each other and can be combined to each other.

DETAILED DISCLOSURE OF PARTICULAR EMBODIMENTS

FIG. 1 schematically illustrates a hybrid semiconductor laser component 1 according to the invention within the scope of its integration in a silicon-based photonic system.

Such a hybrid semiconductor laser component 1 includes:

a first and a second emission module 110, 120 each comprising an active zone 111, 121 made of direct-gap semiconductor materials, such as semiconductors III-V, and shaped to emit an electromagnetic radiation at a given wavelength, an optical layer 200 comprising a first and a second wave guide 210, 220 optically coupled to the active zone 111, 121 of the first and of the second emission module 110, 120 respectively, each wave guide 210, 220 forming with the corresponding active zone 111, 121, an optical cavity resonating at the given wavelength, a heat-dissipating semiconducting layer 310 in thermal contact with the first and second emission modules 110, 120 on a surface of the first and of the second emission module 110, 120 which is opposite to the optical layer 200.

To provide a common ground to the first and the second emission module 110, 120, the hybrid semiconductor laser component 1 also includes, in contact with the heat-dissipating semiconducting layer 310 on a face opposite to the first and the second emission module 110, 120, a first metal layer 321 of a common ground.

The first metal layer 321 is made of a metal material suitable for providing an ohmic contact with the heat-dissipating semiconducting layer 310. Thus, the first metal layer 321 can be a tungsten W layer.

The heat-dissipating semiconducting layer 310 is a layer made of a semiconductor material, such as silicon. According to a preferred possibility of the invention and in order to electrically contact the ground contact provided by the first metal layer 321 with the first and the second emission module 110, 120, the heat-dissipating semiconducting layer 310 can have a resistivity in ohm·cm lower than 9 ohm·cm, or even 4 ohm·cm, up to 0.002 ohm·cm. It can be N (by means of an electron donor doping element such as antimony Sb) or P (by means of an electron acceptor doping element such as boron B) type doped. The heat-dissipating semiconducting layer has preferentially a thickness between 700 μm and 50 μm, still more advantageously between 500 μm and 150 μm, or even substantially equal to 100 μm.

In order to ensure electrical and thermal contact between the heat-dissipating semiconducting layer 310 and the first and second emission modules 110, 120, the hybrid semiconductor laser component 1 also includes a second, a third and a fourth metal layer 322, 323, 324.

Thus, the heat-dissipating semiconducting layer 310 is in contact, on a face which is facing the first and the second emission module 110, 120 with the second metal layer. The second metal layer is made of a metal allowing metal molecular bonding. In one exemplary embodiment, the second metal layer can be made of tungsten W.

The second metal layer 322 is in contact, on a face which is opposite to the semiconducting layer 310, with the third metal layer 323. In order to allow a metal molecular bonding, the third metal layer 323 is made of the same metal as the second metal layer 322. According to the exemplary embodiment, the third metal layer can also be made of tungsten W. Likewise, it will be noted that if mention is made in this description of a third and a fourth metal layer 323, 324, the molecular bonding method used within the scope of this first embodiment enables a second and a third metal layer 322, 323 which are one and a same metal layer which could be referred to as "second metal layer" to be provided. However, in order to facilitate understanding and the link between the hybrid semiconductor laser component 1 and its manufacturing method, a third and a fourth metal layer 323, 324 are referred to as above and in the rest of this document.

The third metal layer 323 is in contact, on a face which is opposite to the second metal layer 322, with the fourth metal layer 324. The fourth metal layer is suitable for providing an ohmic contact with the first and the second emission module 110, 120. Thus, in one exemplary embodiment in which the first and the second emission module 110, 120 are emission modules the first and the second zones 112 and 122 of which are made of P-doped indium phosphorus InP, the fourth metal layer 324 is an ohmic metal contact layer suitable for the P-doped indium phosphorus InP. Thus, the fourth metal layer 324 can for example be a platinum Pt layer. The fourth metal layer 324 can have a thickness between 5 and 40 nm, preferentially between 10 and 20 nm. In this way, the total thickness of the third and of the fourth metal layer 323, 324 can be between 30 and 70 nm and be preferentially between 40 and 60 nm, being advantageously equal to 50 nm.

The fourth metal layer 324 is in contact with the first and the second emission module 110, 120 on one of their face which is opposite to the optical layer 200.

The first and the second emission module 110, 120 are both included in an encapsulation layer 100. The encapsulation layer 100 is made of an electrically insulating material, for example silicon nitride SiN or silicon dioxide $SiO_2$. Such an encapsulation layer 100 enables the flanks of the first and of the second emission module 110, 120 to be passivated, while enabling them to have a substantially planar surface for the connection thereof. Thus, the first and the second emission module 110, 120 are preferably flush with each of the faces of the encapsulation layer 100.

The fourth metal layer 324 is also in contact with the encapsulation layer 100.

According to the practical application, the first and the second emission module 110, 120 each include:
  a first zone 112, 122 made of P-doped indium phosphorus InP, said first zone 111, 121 being flush with the encapsulation layer 100 in contact with the fourth metal layer 324,
  the active zone 111, 121 includes either a plurality of quantum wells shaped to emit an electromagnetic radiation at the given wavelength, said quantum wells being formed by a stack of semiconducting layers of direct-gap semiconductor materials such as a stack of arsenide-gallium phosphide-indium InGaAsP layers and of gallium-indium-aluminium arsenide InGaAlAs layer, or a plurality of quantum dots made of one from arsenide-gallium-phosphide-indium InGaAsP and a gallium-indium-aluminium arsenide InGaAlAs,
  a third zone 113, 123 made of N-doped indium phosphorus InP, said third zone 113, 123 being flush with the encapsulation layer 100 in contact with the optical layer 200 by providing an optical coupling between the active zones 111, 121 and the corresponding wave guides 210, 220.

The materials of the first zone 112, 122 of the active zone 111, 121 and of the third zone 113, 123 indicated above are only given by way of example and can be substituted with other materials without departing from the scope of the invention. Thus, for example, each of the first and second emission modules 110, 120 can include a first zone 111, 121 made of P-doped gallium arsenide GaAs, an active zone 112, 122 formed of quantum wells or quantum dots of aluminium-gallium arsenide AlGaAs, and a third zone 113, 123 made of N-doped gallium arsenide GaAs.

With such a configuration of the first and of the second emission module in the encapsulation layer, the optical coupling between each of the first and second active zones 111, 121 and the corresponding wave guide 210, 220 can be an evanescent or adiabatic type coupling.

The encapsulation layer 100 is also in contact, on the face opposite to the fourth metal layer 324, with the optical layer 200.

According to the exemplary embodiment illustrated in FIG. 1, the optical layer 200 comprises:
  the first and the second wave guide 210, 220,
  a modulator 230 consisting of a wave guide comprising a semiconducting junction PN in order to allow modification of its effective refractive index,
  a side optical output 240 in order to allow a "through the side" type optical coupling,
  a first, a second, a third and a fourth interconnection 251, 252, 253, 254 in order to connect, for the first and the second interconnection 251, 252, the first and the second emission module 110, 120 and, for the third and the fourth interconnection 253, 254, the first and the second semiconducting zone 231, 232 of the semiconducting junction PN of the modulator 230, a filling material 205 enclosing the first and the second wave guides 210, 220, the modulator 230, the optical output 240 and the interconnections 251, 252, 253, the interconnections 251, 252, 253 being flush with the filling material 205.

Of course, alternatively to the side optical output 240 represented in FIG. 1, it is also contemplatable to provide a surface optical output by means of a surface coupling network. Such a possibility is known to those skilled in the art and is described within the scope of FIGS. 4A to 4L.

In the same way and of course, if only four interconnections 251, 252, 253, 254 are represented, a hybrid semiconductor laser component 1 according to the invention can include a higher, or lower, number thereof, without departing from the scope of the invention.

Such an optical layer 200 forms a silicon-based photonic system and can thus integrate optical components such as a Mach-Zehnder type or resonating ring type optical modulator. More precisely, it will be noted that the first and the second wave guide and the modulator are included in a guiding sub-layer 221 of the optical layer.

According to this exemplary embodiment, the first and the second wave guide 210, 220, and the modulator 230 are all three made of silicon Si. More precisely, the first and the second wave guide 210, 220 are made of a low or non doped, that is preferentially intrinsic, silicon and the modulator 230 includes a first and a second semiconducting zone 231, 232, one N-doped, the other P-doped, forming a semiconducting junction to form a modulator known to those skilled in the art (semiconducting junction PN formed in a wave guide perpendicular to the direction of propagation of light).

The first and the second wave guide 210, 220 are both disposed in proximity of the face of the optical layer 200 which is in contact with the encapsulation layer 100 such that the first and the second wave guide 210, 220 are optically coupled to the respective active zone 111, 121 of the first and of the second wave guide 210, 220. Such an optical coupling between the first and the second wave guide 210, 220 and the active zones of the first and of the second emission module 110, 120 enables a first and a second optical cavity resonating at the given wavelength to be formed. These first and second optical cavities resonating at the given wavelength form a first and a second laser cavity respectively.

The first and the second interconnection 251, 252 extend throughout the thickness of the optical layer 200 in order to contact the second zones 113, 123 of the first and of the second emission module 110, 120 respectively. In the same way, the third and fourth interconnections 253, 254 extend over part of the thickness of the optical layer 200 in order to contact the second and the first semiconducting zone 232, 231 respectively of the third wave guide in order to allow modulation of the effective refractive index of the wave guide of the modulator 230.

Thus, with such a configuration of the hybrid laser component 1, the first and the second emission module 110, 120 are both in thermal and electrical contact by their respective second zone 113, 123 with the heat-dissipating semiconducting layer 310 by means of the second, third and fourth metal layers 322, 323, 324. The first and the second emission modules 110, 120 thus have a common ground provided by the heat-dissipating semiconducting layer 310 and are polarised by the first and the second interconnection 251, 252 respectively.

Figure 2A:
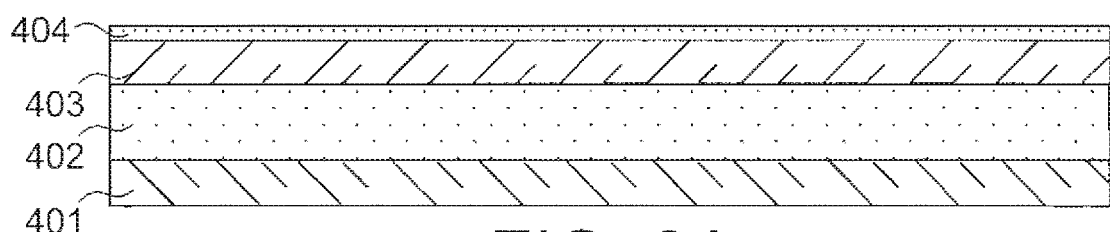
FIGS. 2A to 2M illustrate as a longitudinal cross-section view, the main steps for manufacturing a hybrid semiconductor laser component as illustrated in FIG. 1, FIGS. 3A to 3D schematically illustrate as a longitudinal cross-section view, the specific steps for manufacturing a semiconductor laser component according to a second embodiment of the invention in which the thermal contact between a first emission module and a heat-dissipating layer is provided by means of copper layers also acting as an electrical contact for said first emission module, FIGS. 4A to 4M schematically illustrate as a longitudinal cross-section view, the main steps for manufacturing an emission module according to a third embodiment of the invention in which the first emission module and the first wave guide have a configuration especially suitable for an adiabatic mode transformation optical coupling, FIG. 5 schematically illustrates as a longitudinal cross-section view, a hybrid semiconductor laser component according to a fourth embodiment in which a return of the interconnections of the emission module is provided, FIG. 6 schematically illustrates as a longitudinal cross-section view, a hybrid semiconductor laser component according to a fifth embodiment which differs from a laser component according to the fourth embodiment in that the first and the second interconnection of the emission module has a return on a first intermediate interconnection level to a second metal layer of the component, FIGS. 7A and 7B schematically illustrate and as a longitudinal cross-section view, a hybrid semiconductor laser component according to a sixth embodiment which differs from a hybrid semiconductor laser component according to the fifth embodiment in that conductive vias passing through the dissipation layer are provided, in order to make it possible to contact a control electronics through the dissipation layer.
Figure 2B:
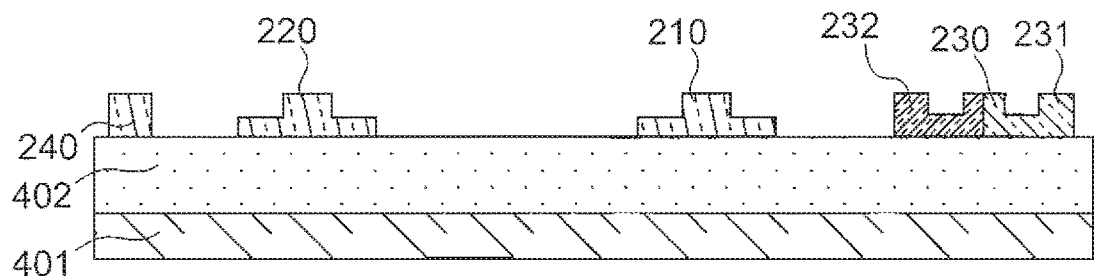
Figure 2C:
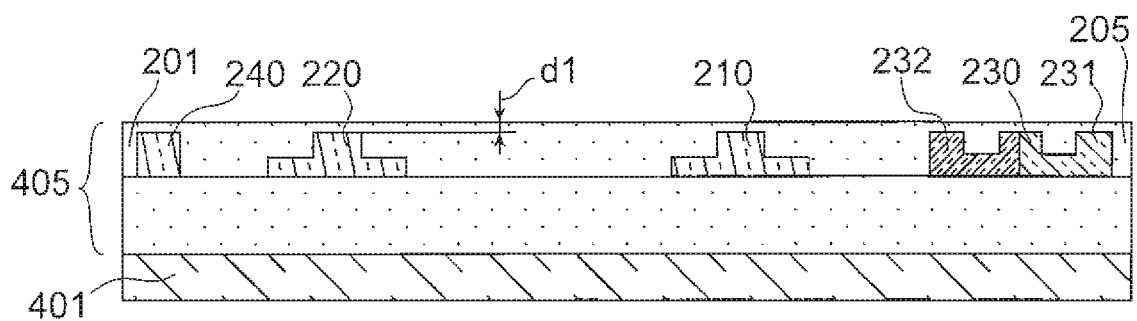
Figure 2D:
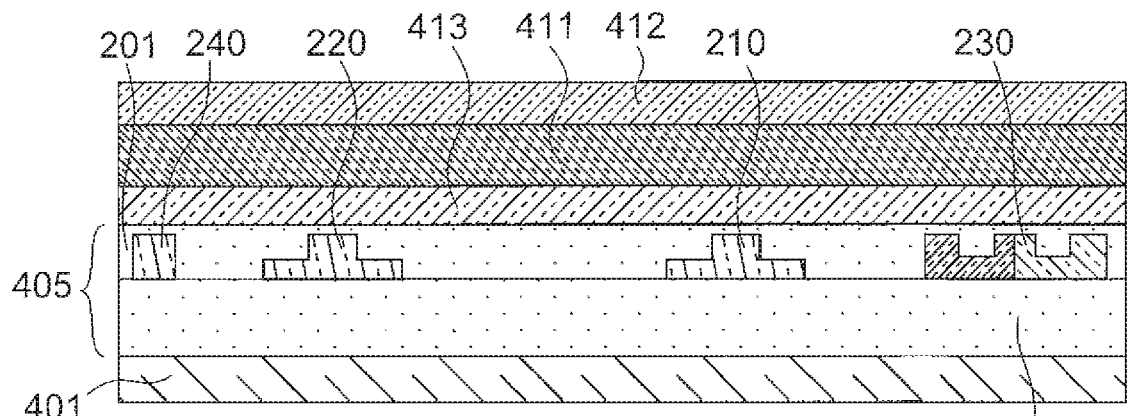
Figure 2E:
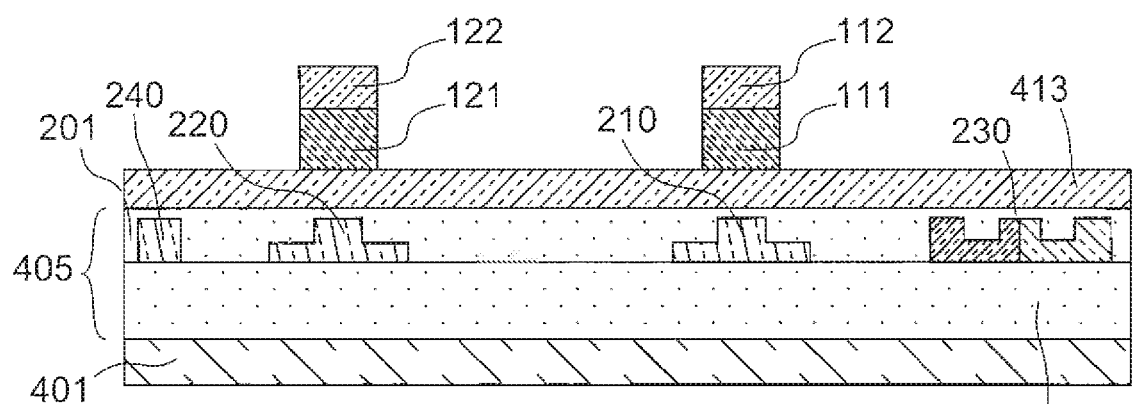
Figure 2F:
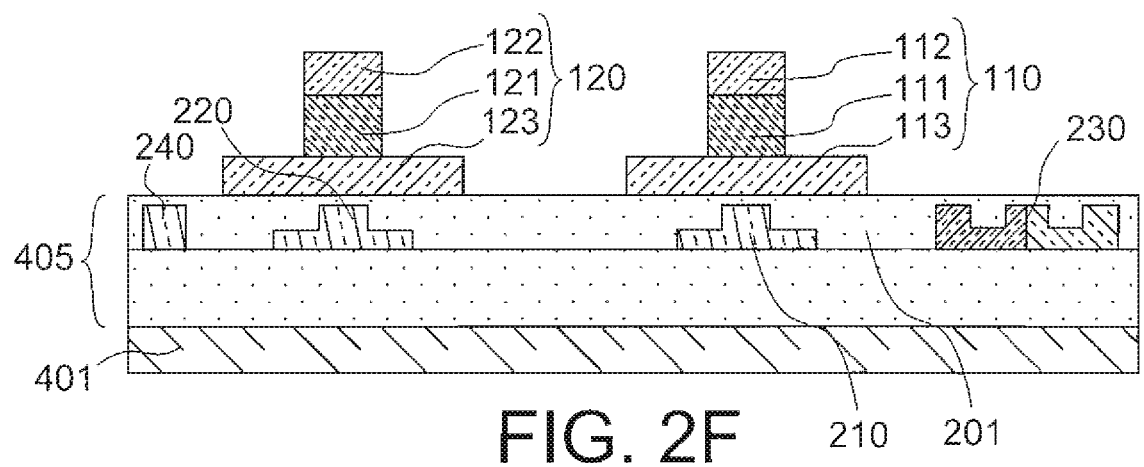
Figure 2G:
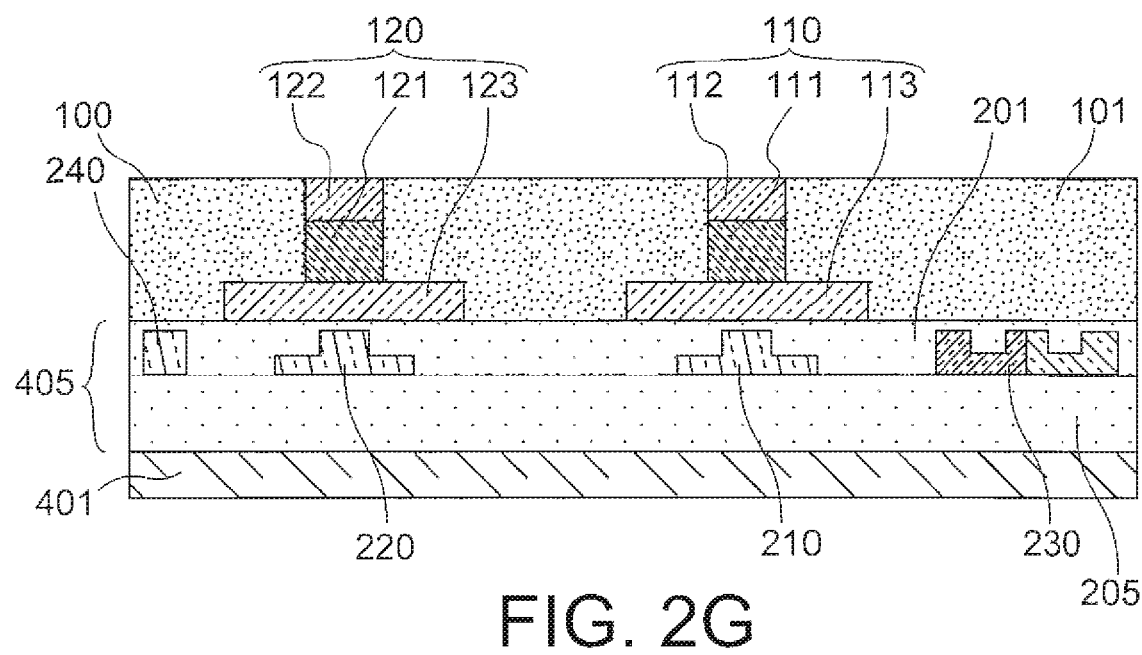
Figure 2H:
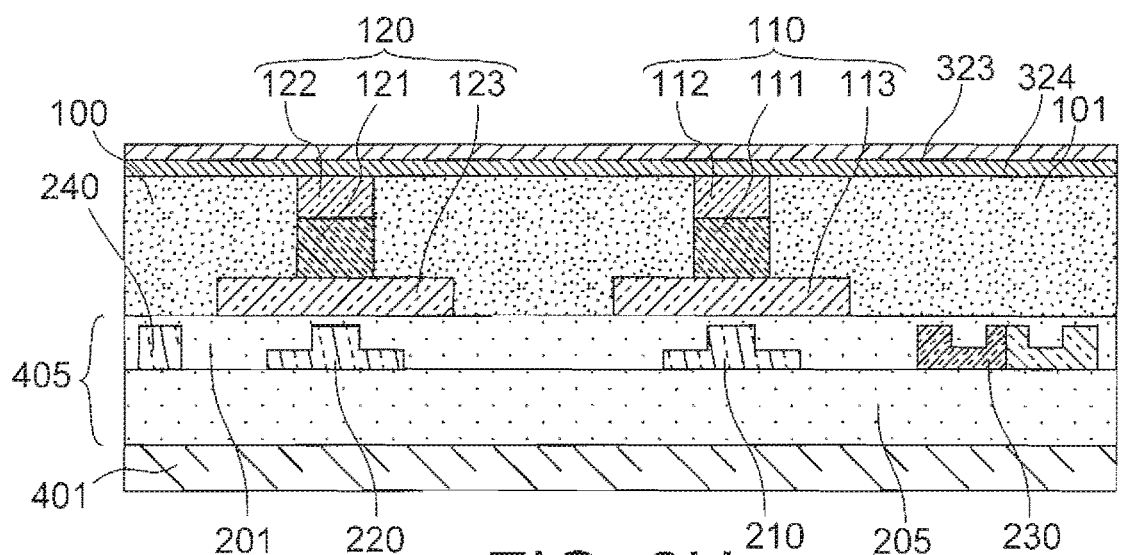
Figure 2I:
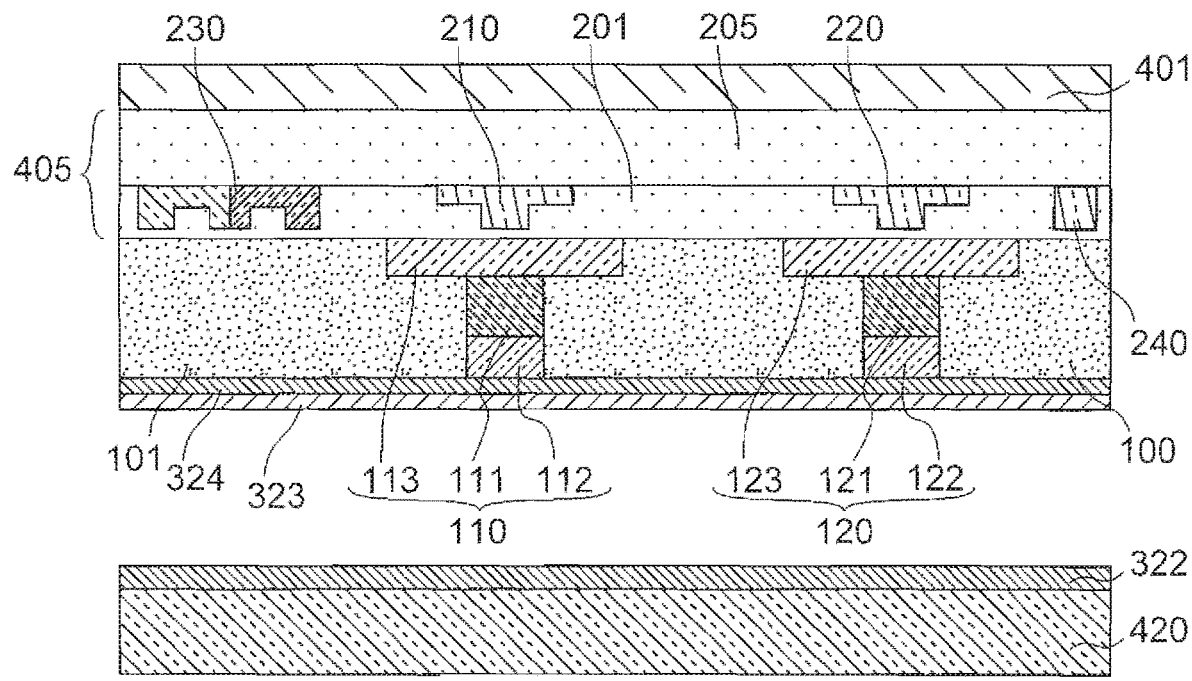
Figure 2J:
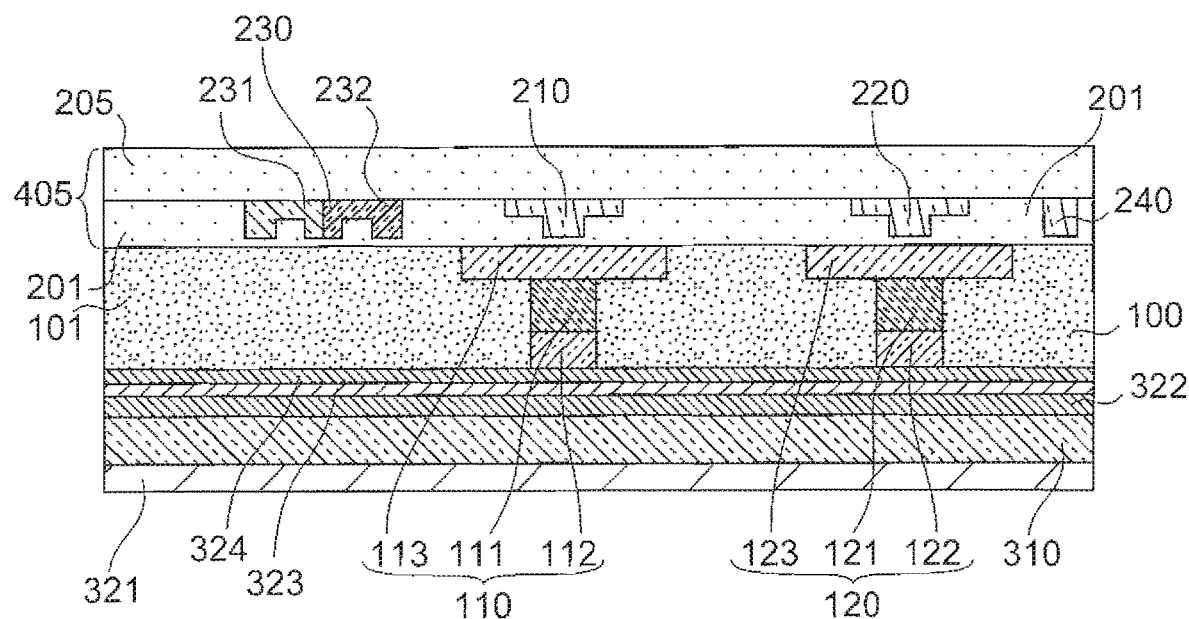
Figure 2K:
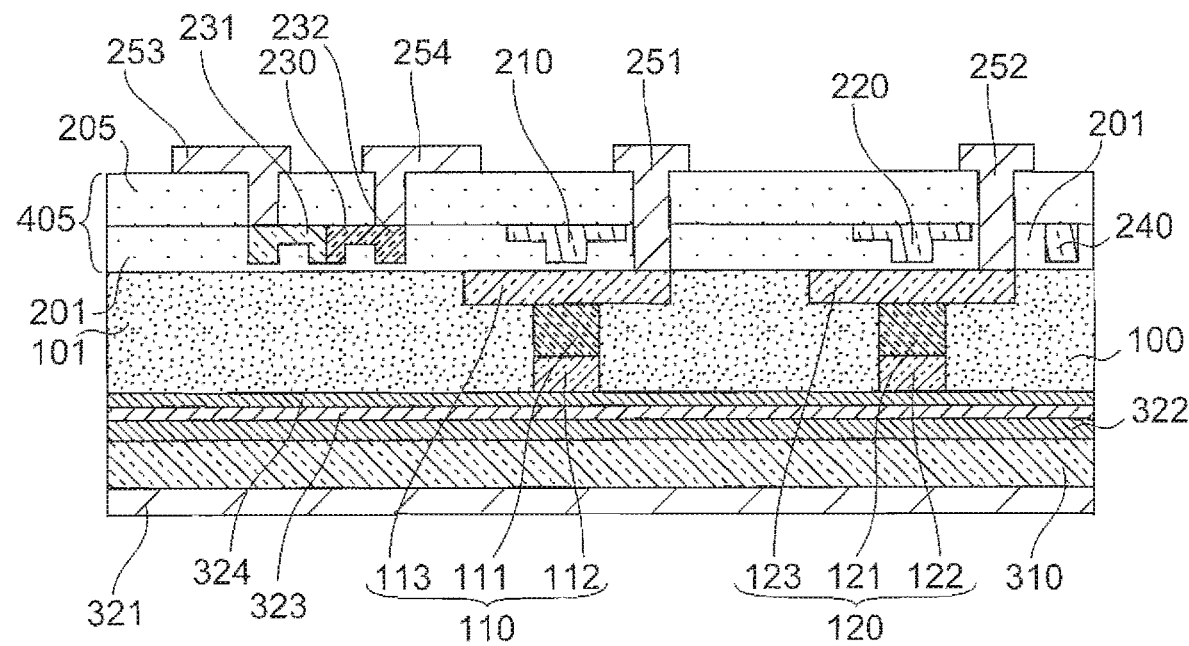
Figure 2L:
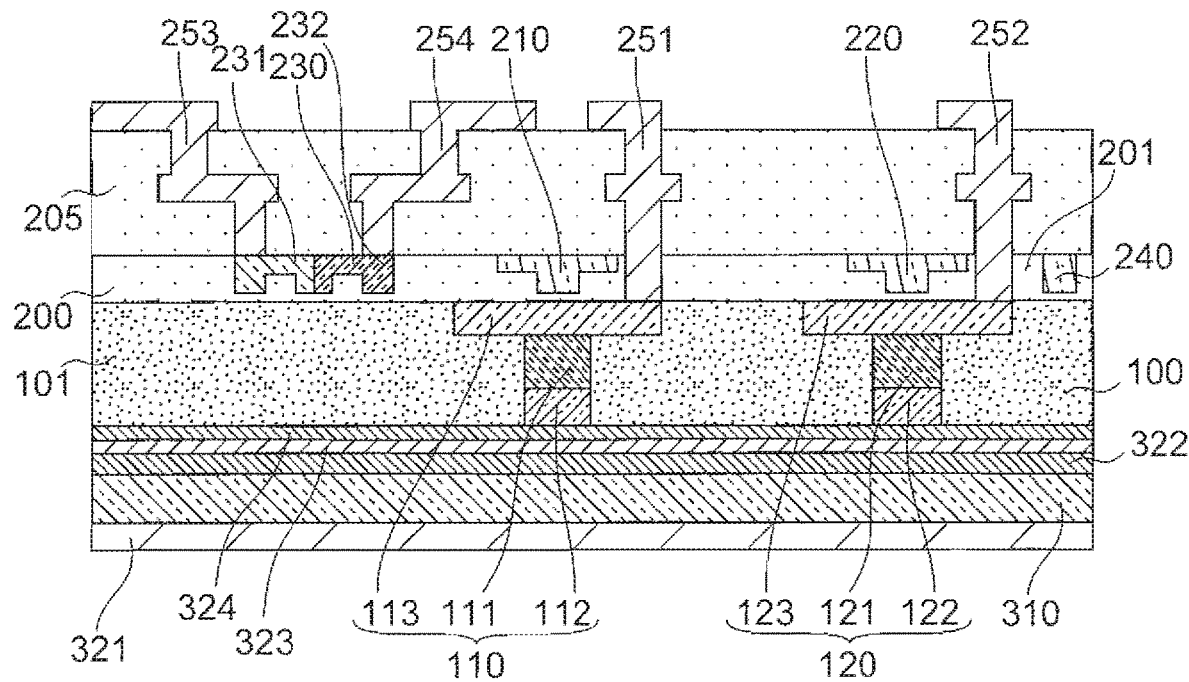
Figure 2M:
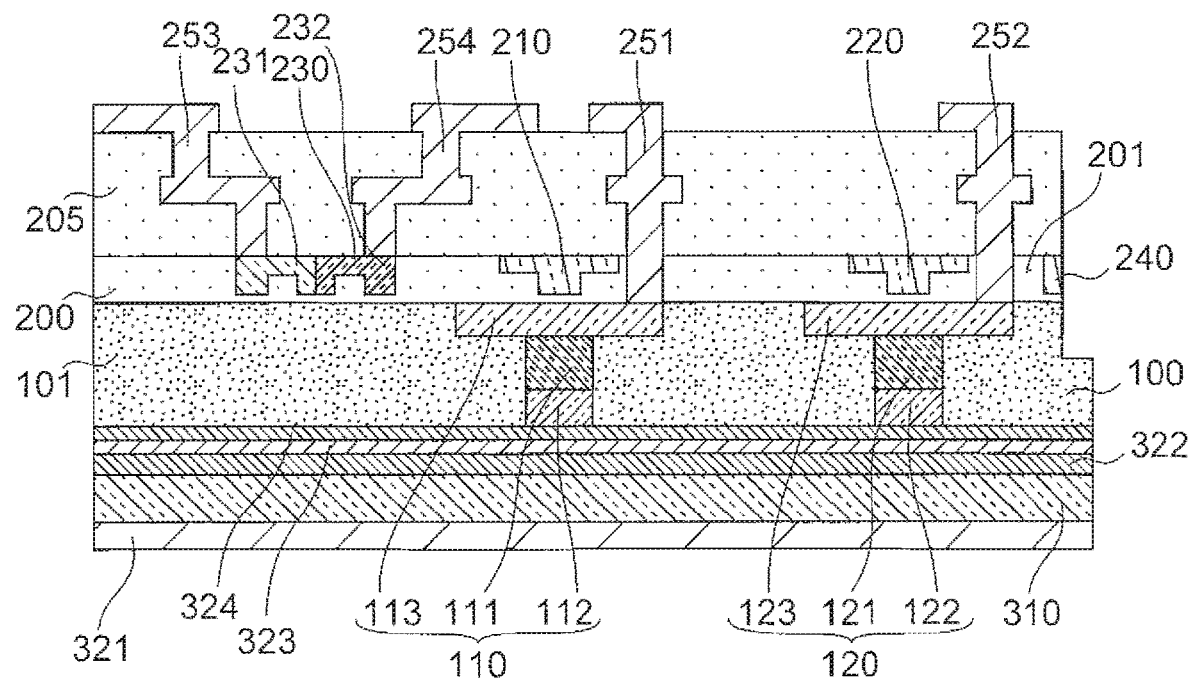

The hybrid semiconductor laser 1 according to the practical aspect of this first embodiment can be, in reference to FIGS. 2A to 2M, manufactured by a manufacturing method including the following steps of:

providing a silicon-on-insulator type semiconductor substrate, said substrate including a first silicon support 401 on top of which a silicon dioxide layer 402 is provided, in turn on top of which a silicon layer 403 is provided as illustrated in FIG. 2A, forming in the silicon layer 403, through etching and implantation, the first and second and third wave guide 210, 220, of the modulator 230 and the optical output 240, the rest of the silicon layer being removed by etching, as illustrated in FIG. 2B, encapsulating the first, second wave guides 210, 220, of the modulator 230 and the optical output 240 by the insulating filling material 205, for example of silicon dioxide, followed by planarizing the filling material, so as to form a first part 405 of the optical layer 200 comprising the guiding sub-layer 201, the first and the second wave guide 210, 220 being at a distance d1 from the face of said first part 405 opposite to the silicon support 401 which is compatible with an evanescent or adiabatic type optical coupling, as illustrated in FIG. 2C, forming, in contact with the face of the first part 405 which is opposite to the silicon support 401, a stack of layers comprised of a first N-doped indium phosphorus layer 413, an active layer 411 including a plurality of quantum wells or quantum dots and a second P-doped indium-phosphorus layer 412, as illustrated in FIG. 2D, etching the second indium phosphorus layer 412 and the active layer 411 in order to form the first zones 112, 122 and the active zones 111, 121 of the first and of the second emission module 110, 120 respectively, the rest of the second indium phosphorus layer 412 and the active layer 411 being removed during this etching, as illustrated in FIG. 2E, etching the first indium phosphorus layer 413 in order to form the second zones 113, 123 of the first and of the second emission module 110, 120 respectively and thus form the first and the second emission module 110, 120, as illustrated in FIG. 2F, encapsulating the first and the second emission module in an insulating material, for example silicon nitride SiN or silicon dioxide $SiO_2$ in order to form the encapsulation layer 100, and planarizing said insulating material such that the first zones 112, 122 of each of the first and of the second emission module 110, 120 are flush therewith, as illustrated in FIG. 2G, successively depositing the fourth and the third metal layer 324, 323 in contact with the encapsulation layer 100 and the fourth metal layer 324 respectively, the fourth metal layer 324 being in electrical and thermal contact with the first zone 112, 122 of the first and second emission modules 110, 120, as illustrated in FIG. 2H, providing a second silicon support 420 on which the second metal layer 322 has been previously deposited, as illustrated in FIG. 2I, performing a metal molecular bonding of the second and third metal layers 322, 323, as illustrated in FIG. 2J, removing the silicon support 401, forming a first interconnection layer 431, the first portions of the first, second and third and fourth interconnections 251, 252, 253, 254 being thereby formed in contact with the first and the second emission module 110, 120 respectively, of each of the first and the second semiconducting zone 231, 232 of the modulator 230, as illustrated in FIG. 2K, forming a second interconnection layer 432, a second portion of the first, second, third and fourth interconnections 251, 252, 253, 254 so as to form the first, second, third, and fourth interconnections 251, 252, 253, 254 and the optical layer 200, as illustrated in FIG. 2L, etching a side portion of the optical layer 200 and the encapsulation layer 100 in order to provide side access to the optical output 240 and thus allow a "through the side" optical coupling, as illustrated in FIG. 2M, thinning the second substrate to form a heat-dissipating semiconducting layer 310, forming the first metal layer 321 on the face of the heat-dissipating semiconducting layer 310 which is opposite to the optical layer 200 to form thereby the hybrid laser component as illustrated in FIG. 1.

The step of forming, in contact with the face of the first part 405 which is opposite to the silicon support 401, a stack of layers composed of a first N-doped indium phosphorus layer 413, an active layer 411 including a plurality of quantum wells or quantum dots and a second P-doped indium phosphorus layer 412, can be made by successively epitaxially deposition the first indium phosphorus layer 413, the active layer 411 and the second indium phosphorus layer 412. Alternatively, such a formation step can also be implemented by bonding a substrate including the first indium phosphorus layer 413, the active layer 411 and the second indium phosphorus layer 412 and removing the support carrying said layers. It is to be noted that it is this possibility that is described hereinafter in connection with the third embodiment and FIGS. 4G and 4H.

It is also to be noted that the step of etching a side portion of the optical layer 200 and the encapsulation layer 100 is made for the purpose of a "through the side" coupling. Thus, in the event that no optical coupling is provided or that the optical coupling is other than a "through the side" optical coupling, this step is of course not implemented and can be substituted with a step of forming another coupling element, such as a surface coupling network.

In order to ensure an evanescent optical coupling, the distance d1 between each emission module 110, 120 and the corresponding wave guide 210, 220 is between 1 to 200 nm.

Figure 3A:
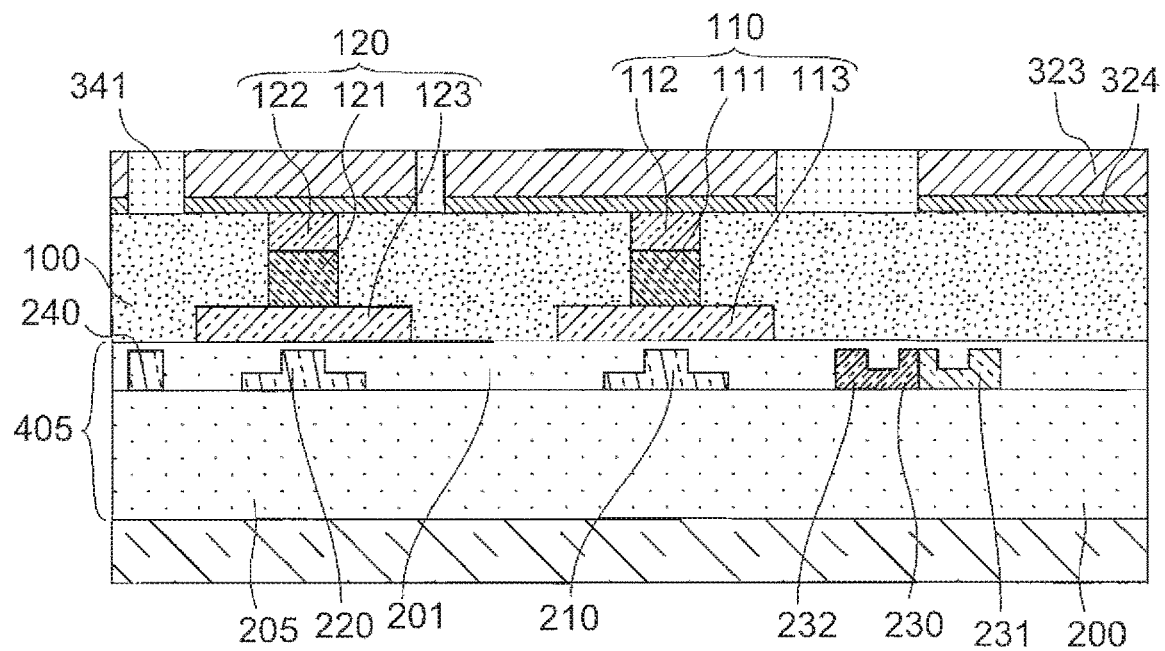
Figure 3B:
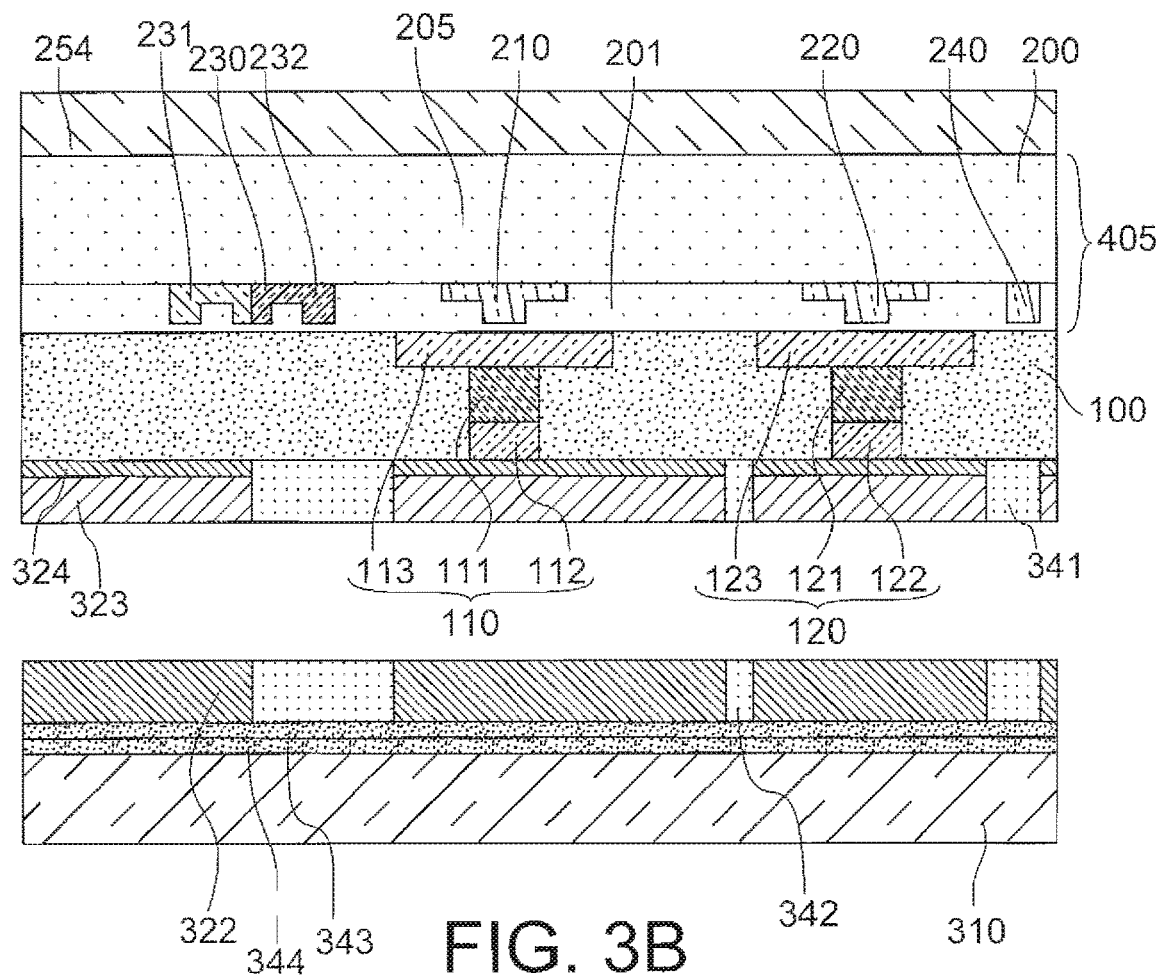
Figure 3C:
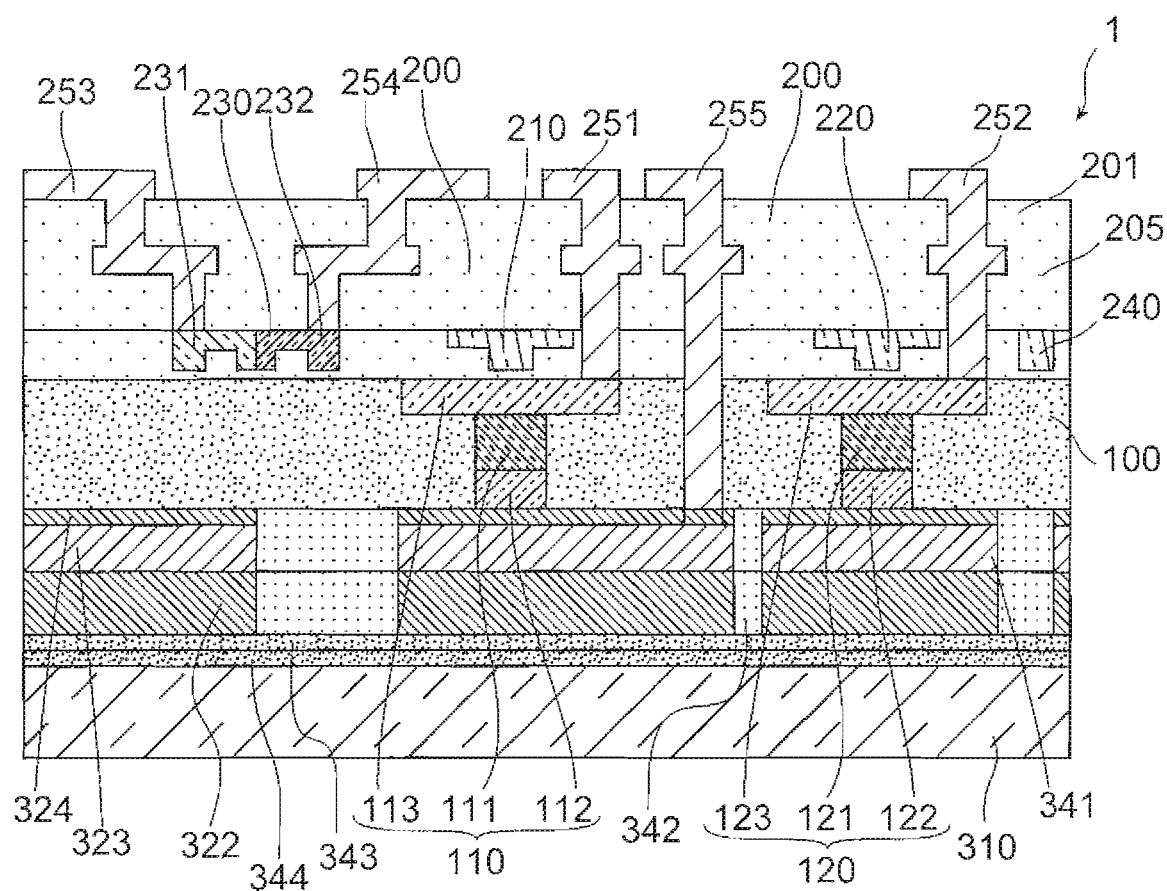
Figure 3D:
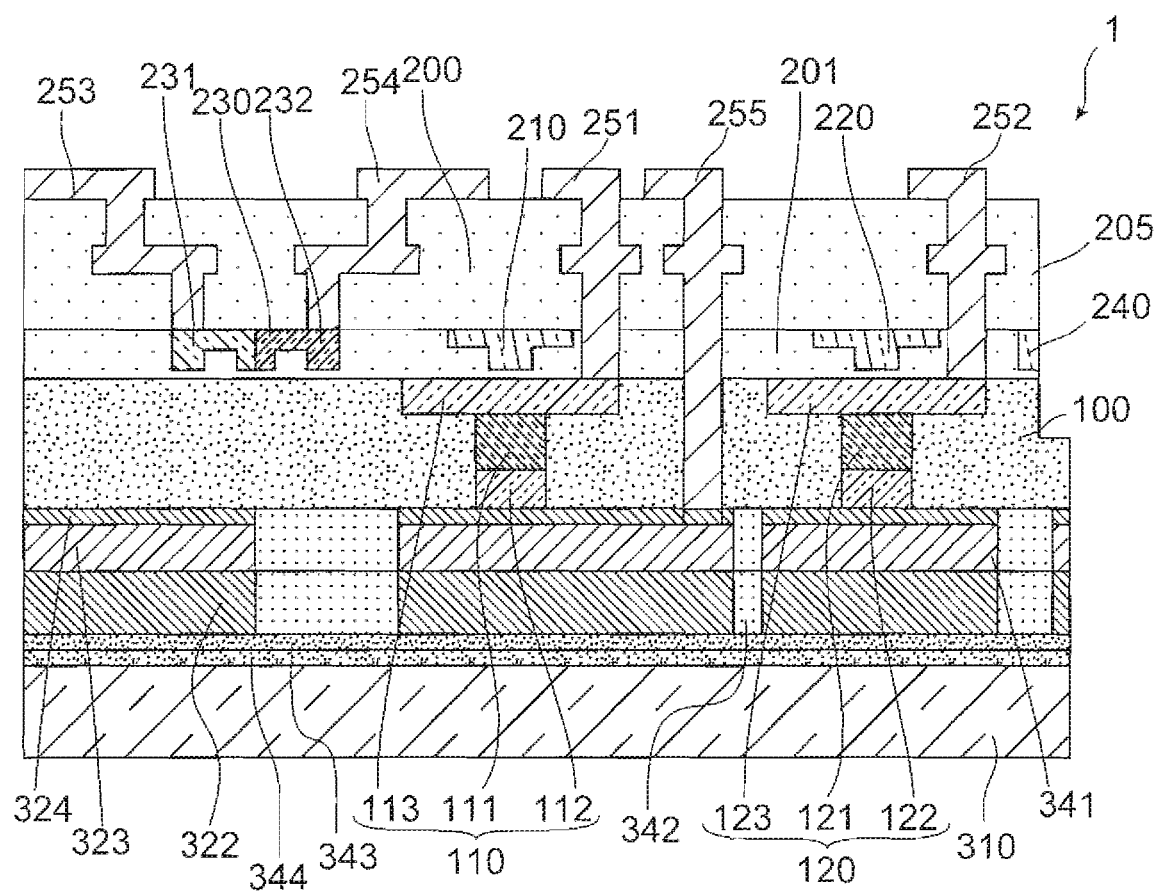

FIG. 3D illustrates a hybrid semiconductor laser component 1 according to a second embodiment of the invention in which there is no common ground electrical contact provided, all the connections being provided by means of interconnections 251, 252, 253, 254, 255 passing through the optical layer 200. A hybrid semiconductor laser component 1 according to this second embodiment differs from the hybrid semiconductor laser component 1 according to the first embodiment in that the second, third and fourth metal layers 322, 323, 324 are divided into several interconnection zones by means of insulating barriers 241, 242 and in that the same second, third and fourth metal layers 322, 323, 324 are electrically insulated while being put in thermal contact with the heat-dissipating semiconducting layer 310 by means of a first and a second electrically insulating layer 343, 344.

Thus, in this second embodiment, the second, third and fourth metal layers 322, 323, 324 form, because of the insulating barriers 241, 242, an interconnection layer to connect the first zones 212, 222 of each of the first and the second emission module 110, 120. In order to connect this interconnection layer formed by the second, third and fourth metal layers 322, 323, 324, the component includes interconnections 255 passing through the encapsulation layer 100 and the optical layer 200. In this way, all the connections of the hybrid semiconductor component are available on the face of the optical layer 200 which is opposite to the heat-dissipating semiconducting layer 310.

It will be noted that, for the sake of brevity, only a fifth interconnection 255 is illustrated for providing the ground contact of the first emission module 110. Of course, if the interconnection for providing the ground contact of the second emission module 120 is not represented in FIG. 3D, it is however present in order to ensure polarisation of the second emission module 120 with a configuration similar to that of the fifth interconnection 255.

Within the scope of a practical application of the invention, in the same way as in the first embodiment, the fourth metal layer 324 can for example be a platinum Pt layer. The third and the second metal layer 322, 323 are made of copper to provide a hybrid copper/insulator bonding as described by Y. Beilliard et al. in their works presented within the scope of the conference "3D Systems Integration Conference" from 2 to 4 Oct. 2013 and published as a conference act on 9 Jan. 2014 as "Chip to wafer copper direct bonding electrical characterisation and thermal cycling".

The insulating barriers 341, 342 are formed, for a first part 341, in the fourth and third metal layers 323, 324, and for a second part 342, in the second metal layer 322. The first part 341 of the insulating barriers 341, 342 is in accordance with the second part 342 so as to avoid any short-circuit between the interconnection zones formed in the second, third and fourth metal layers 322, 323, 324. According to the practical application of the invention, the insulating barriers 341, 342 can be made of silicon dioxide $SiO_2$.

The first and the second electrically insulating layer 343, 344 are made of silicon nitride SiN and silicon dioxide $SiO_2$ respectively. In order to provide a thermal contact between the heat-dissipating semiconducting layer 310 and the first and second emission modules 110, 120, the first and second electrically insulating layers 343, 344 each have a thickness between 10 and 50 nm, preferentially between 15 and 30 nm and advantageously equal to 20 nm.

Thus, if the example given upon introducing the definition of "thermal contact" is taken, that is a laser module having a contact surface of 1 mm per 5 µm, the first electrically insulating layer 343 thus has a thermal resistance between $2 \cdot 10^{-9}$ and $4 \cdot 10^{-10}$ $m^2 \cdot K \cdot W^{-1}$ and the second electrically insulating layer 344 has a thermal resistance between $23 \cdot 10^{-9}$ and $8 \cdot 10^{-9}$ $m^2 \cdot K \cdot W^{-1}$. The cumulative thermal resistance of the first and the second electrically insulating layer 343, 344 is between $25 \cdot 10^{-9}$ and $8.4 \cdot 10^{-9}$ $m^2 \cdot K \cdot W^{-1}$ and is thus lower than $3 \cdot 10^{-8}$ $m^2 \cdot K \cdot W^{-1}$.

Of course, such a configuration in which the interface between each emission module 110, 120 and the heat-dissipating semiconducting layer 310 is provided by the first and the second electrically insulating layer 343, 344 described above is only given by way of example. Thus, a hybrid semiconductor laser component 1 according to the invention can have an interface between each emission module 110, 120 and the heat-dissipating semiconducting layer 310 provided by a number of layers other than two and having different materials without departing from the scope of the invention as long as the thickness of said layer(s) is adapted such that the thermal resistance between the surface of the first emission module and the semiconducting layer is lower than $1 \cdot 10^{-7}$ $m^2 \cdot K \cdot W^{-1}$, preferentially lower than $5 \cdot 10^{-8}$ $m^2 \cdot K \cdot W^{-1}$ and still more advantageously lower than $3 \cdot 10^{-8}$ $m^2 \cdot K \cdot W^{-1}$, or even $2 \cdot 10^{-8}$ $m^2 \cdot K \cdot W^{-1}$.

According to an advantageous alternative, at least one of the first and the second electrically insulating layer 343, 344 is made of a High-K dielectric. In this manner, it is possible to reduce the thickness of said electrically insulating layer by keeping an adapted electrical insulation.

In this second embodiment, the heat-dissipating semiconducting layer 310 is an intrinsic silicon layer and has a thickness of 700 μm.

The method for manufacturing a hybrid semiconductor laser component 1 according to this second embodiment differs from the method for manufacturing a hybrid semiconductor laser component 1 according to the first embodiment in that after the step of successively depositing the fourth and the third metal layer 324, 323 in contact with the encapsulation layer 100 and the fourth metal layer 324 respectively, as illustrated in FIG. 2H, the following steps are provided:

- locally etching the third and fourth metal layers 324, 323 so as to form the interconnection zones and depositing the first part 341 of the insulating barriers 341, 342, as illustrated in FIG. 3A,
- providing the heat-dissipating semiconducting layer 310, this one having on one of its faces, the second metal layer 322 on which the interconnection zones have been formed by means of the second part 342 of the insulating barriers 341, 342, as illustrated in FIG. 3B,
- copper/insulator hybrid bonding the second metal layer 322 and the third metal layer 323, as illustrated in FIG. 3C,
- etching a side portion of the optical layer 200 and the encapsulation layer 100 in order to provide side access to the optical output 240 and thus allow a "through the side" optical coupling, the hybrid semiconductor laser component 1 being thus formed, as illustrated in FIG. 3D.

FIG. 4N illustrates a hybrid semiconductor laser component 1 according to a third embodiment which has the feature to be obtained according to a manufacturing method alternative to that described for the hybrid semiconductor laser component 1 according to the first embodiment and which is adapted to form an adiabatic optical coupling between each emission module 110, 120 and the corresponding wave guide 210, 220 through mode transformation. The hybrid semiconductor laser component 1 according to this third embodiment differs from a hybrid semiconductor component 1 according to the first embodiment in that the optical layer 200 has a different shape.

Of course, the hybrid semiconductor laser component 1 has in this third embodiment a configuration adapted to provide a mode transformation adiabatic optical coupling between each emission module 110, 120 and the corresponding wave guide 210, 220, such a configuration is also compatible with an evanescent optical coupling. Thus, alternatively, the hybrid semiconductor laser component 1 according to this third embodiment can also have an optical evanescent type coupling between at least one from the first and the second emission module 110, 120 and the corresponding wave guide 210, 220.

Thus, the optical layer 200 according to this third embodiment includes:

- a first and a second wave guide 210, 220,
- a modulator 230,
- a first, second, third and fourth interconnection 251, 252, 253, 254 to connect, for the first and the second interconnection 251, 252, the first and the second emission module 110, 120, and for the third and fourth interconnections 253, 254, the first and second semiconducting zones 231, 232 of the modulator,
- an optical output 241 by the surface taking the form of an optical network in order to enable the photonic system formed by the optical layer to be coupled with an outer element or another wave guide,
- a filling material 205 enclosing the first and the second wave guide 210, 220, the modulator 230 and the first to fourth interconnections 251, 252, 253, 254.

Figure 4A:
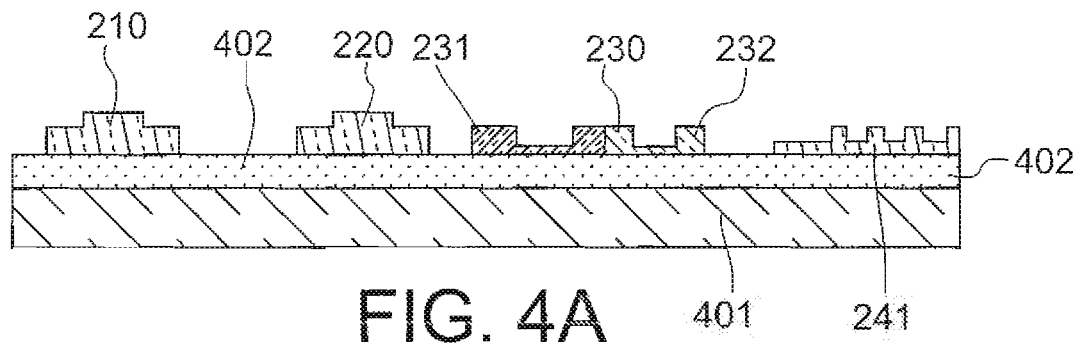
Figure 4B:
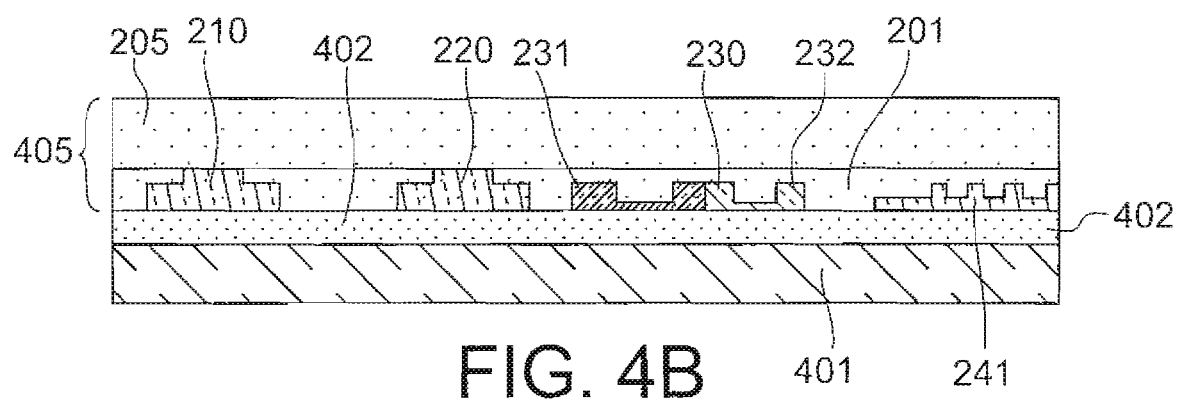
Figure 4C:
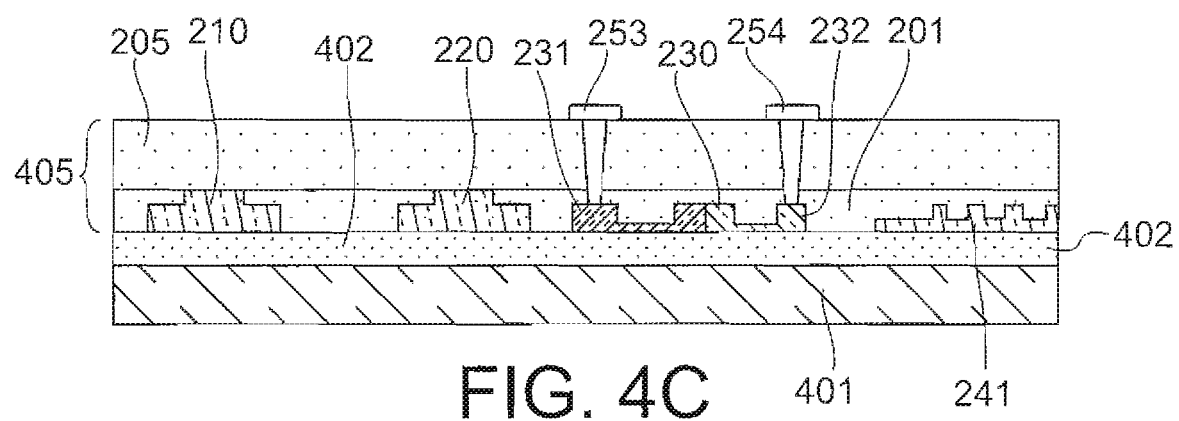
Figure 4D:
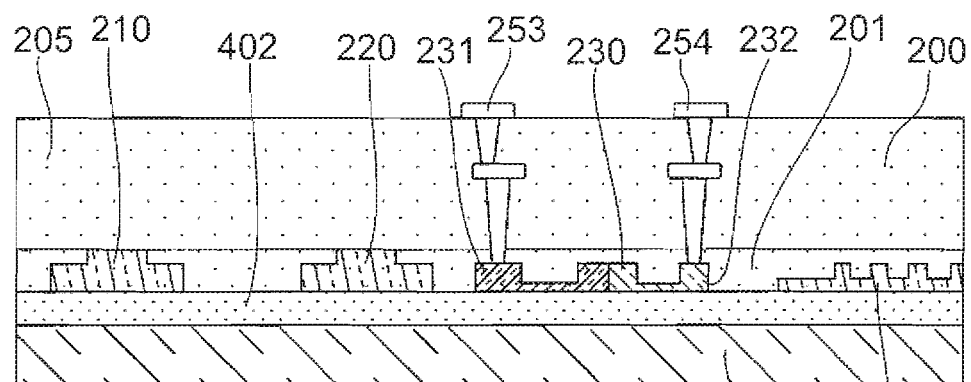
Figure 4E:
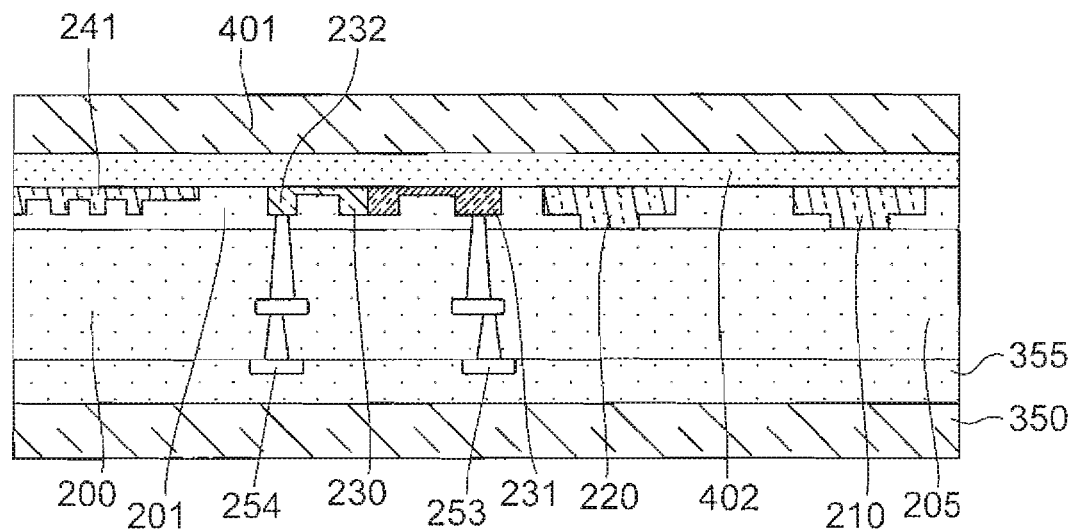
Figure 4F:
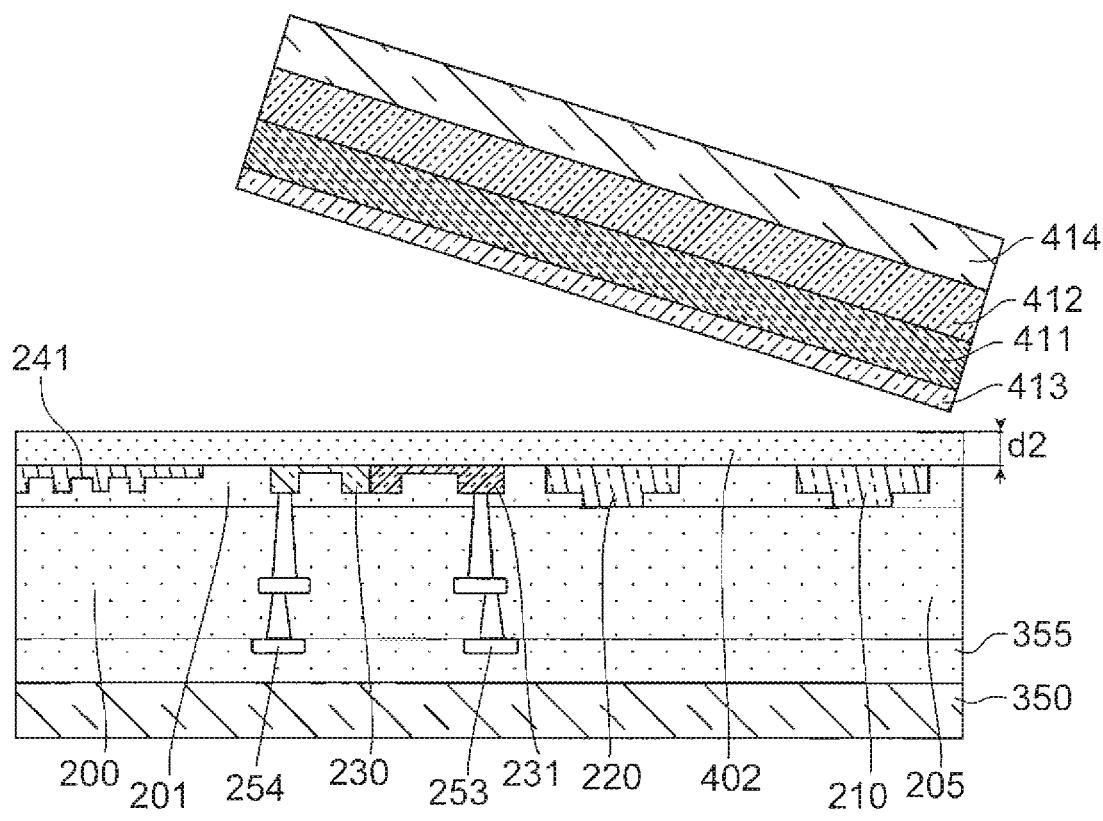
Figure 4G:
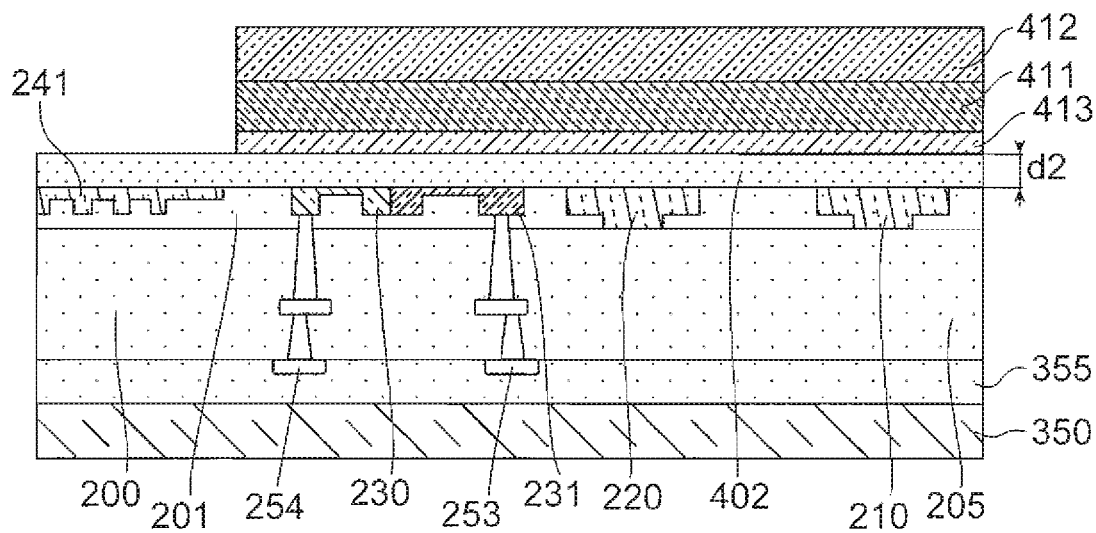
Figure 4H:
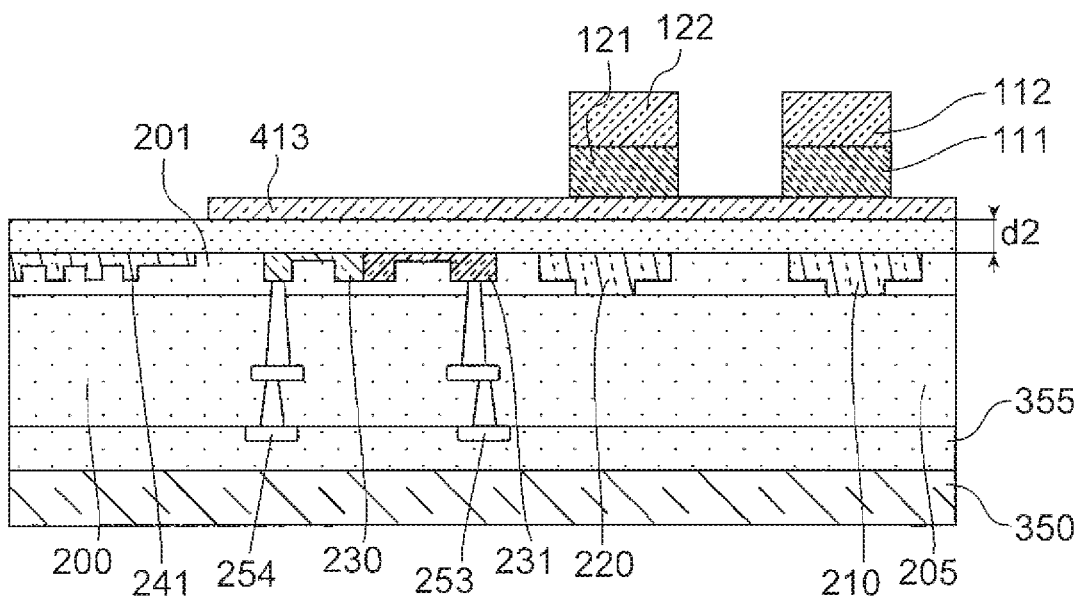
Figure 4I:
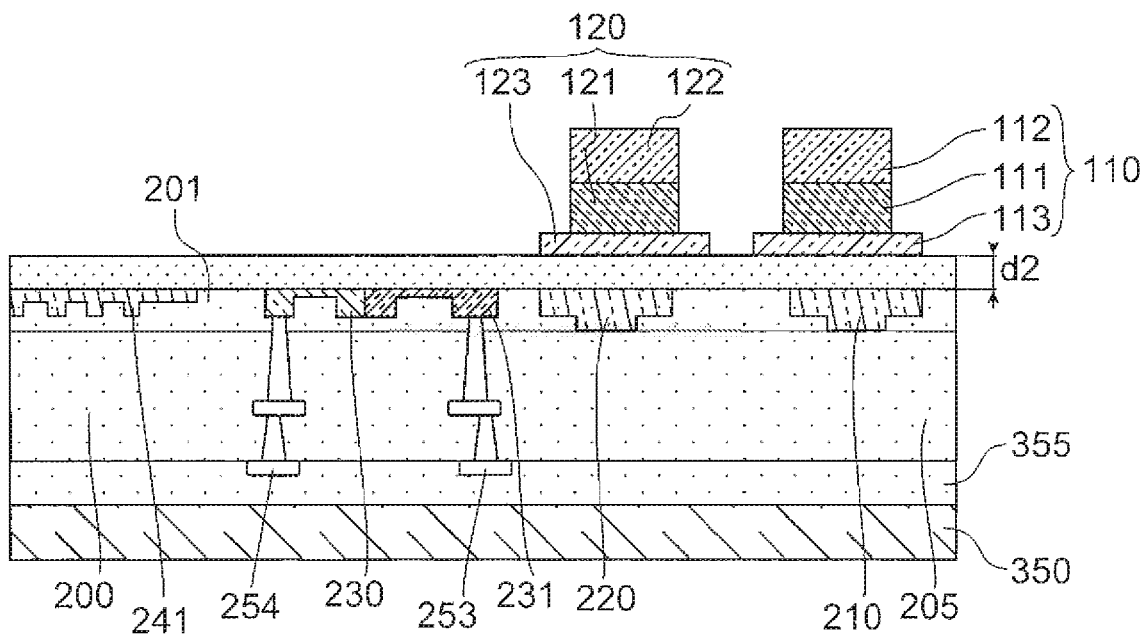
Figure 4J:
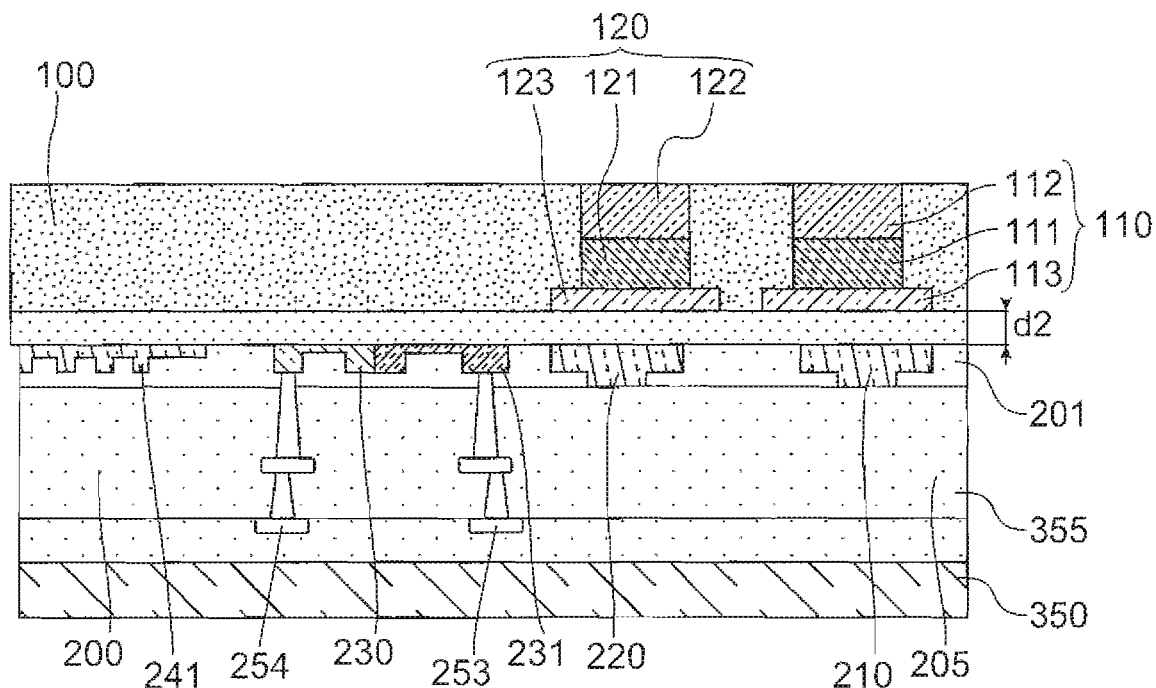
Figure 4K:
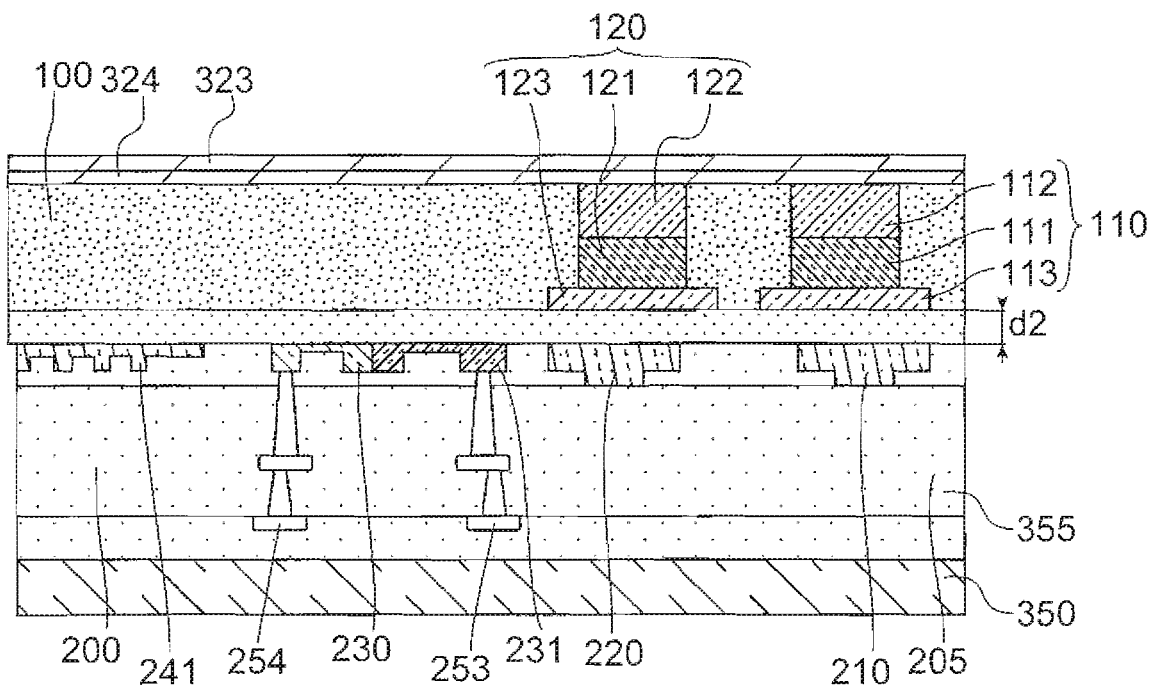
Figure 4L:
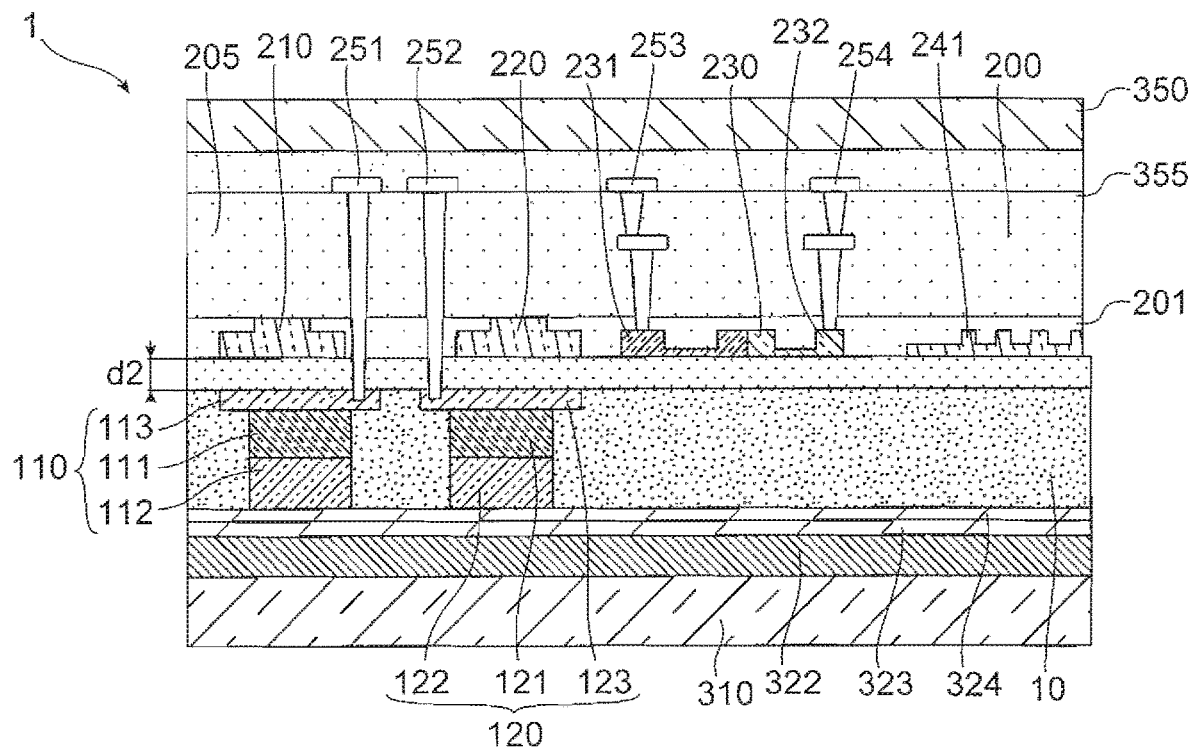
Figure 4M:
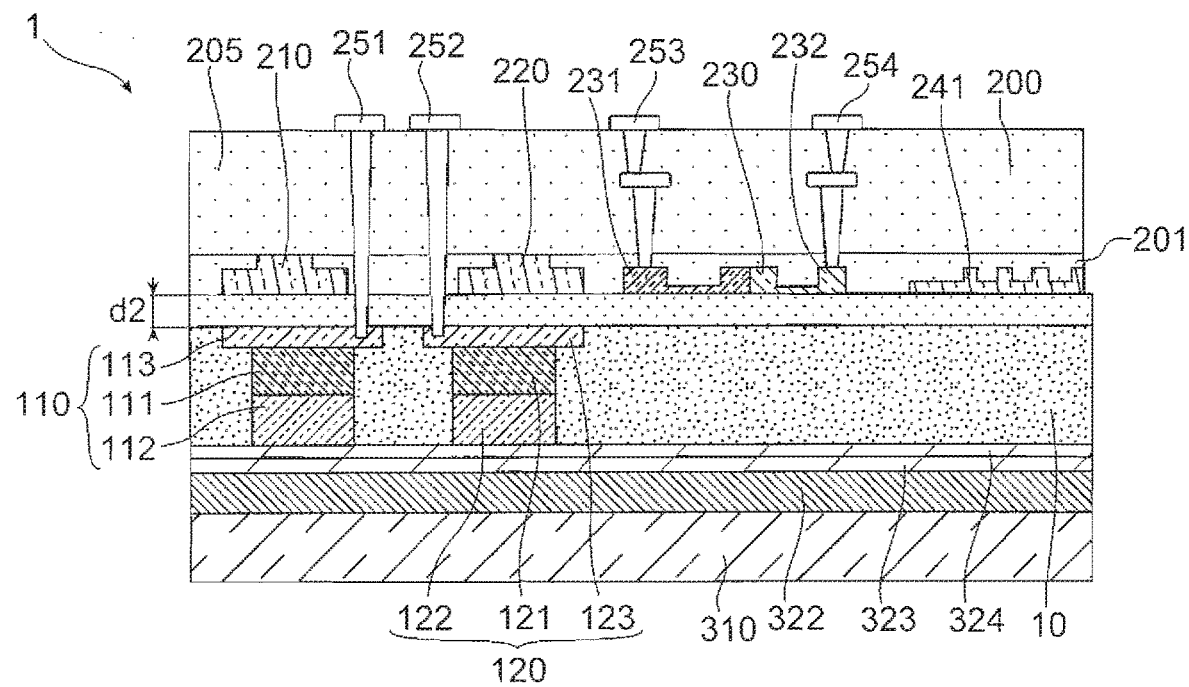

A method for manufacturing a hybrid semiconductor laser component 1 according to this third embodiment includes, in reference to FIGS. 4A to 4N, the following steps of:

- providing an insulator semiconductor type substrate including a first support 401, an insulator layer 402 and a silicon layer,
- forming in the silicon layer, by localised etching and implantation, the first and the second wave guide 210, 220, the modulator 230 and the optical output 241, as illustrated in FIG. 4A,
- encapsulating the first wave guide 210, the modulator 230 and the optical output 241 by the filling material 205, that is silicon dioxide, so as to form a first part 405 of the optical layer 200, the first and the second wave guide 210, 220 being at a distance d2 from the face of said first part 405 opposite to the silicon support 401, as illustrated in FIG. 4B,
- forming a first interconnection layer 431, the first portions of a third and a fourth interconnection 253, 254 being thereby formed in contact with the first and the second semiconducting zone 231, 232 of the modulator 230, as illustrated in FIG. 4C,
- encapsulating the first portions of the third and the fourth interconnection 253, 254 with the filling material 205,
- forming a second interconnection layer 432, a second portion of the third and fourth interconnections 253, 254 so as to form the third and fourth interconnections 253, 254 and the optical layer 200, as illustrated in FIG. 4D,
- encapsulating the second portions of the third and fourth interconnections 253, 254 with the filling material 205 and planarizing in order to form a bonding layer 355, as illustrated in FIG. 4E,
- performing a molecular bonding of the bonding layer on a substrate 350, called transport substrate,
- removing the silicon support 401, as illustrated in FIG. 4F,
- optionally thinning the insulator layer 402 in order to define the distance d2 between each emission module 110, 120 and the corresponding wave guide 210, 220,
- providing a third semiconductor support 414 of indium phosphorus InP comprising on one of its faces a second indium phosphorus layer 412, the second indium phosphorus layer 412 being covered with an active layer 411 including a plurality of quantum wells, itself covered with a first indium phosphorus layer 413,
- performing a molecular bonding of the first indium phosphorus layer 413 on the insulator layer 402, as illustrated in FIG. 4G,
- removing the third semiconductor support 414,
- etching the second indium phosphorus layer 412 and the active layer 411 in order to form the first zone 112, 122 and the active zone 111, 121 of the first and the second emission module 110, 120, the rest of the second indium phosphorus layer 412 and the active layer 411 being removed during this etching, as illustrated in FIG. 4H,
- etching the first indium phosphorus layer 413 in order to form the second zone 113, 123 of the first and the second emission module 110, 120 and thus forming the first and the second emission module 110, as illustrated in FIG. 4I, encapsulating the first emission module 110 into silicon nitride SiN or silicon dioxide $SiO_2$ in order to form the encapsulation layer 100, as illustrated in FIG. 4J, depositing the third and the fourth metal layer 323, 324 in contact with the encapsulation layer 100, the fourth metal layer 324 being in contact with the first zone 112 of the first emission module 110, as illustrated in FIG. 4K, providing a second silicon support forming the heat-dissipating semiconducting layer 310, the second metal layer 322 having been previously deposited onto one of the faces of this second support, performing a metal molecular bonding of the second silicon support 420 by means of the second and third metal layers 322, 323, as illustrated in FIG. 4L, removing the transport substrate 350, removing the bonding layer 355, forming a first and a second interconnection 251, 252 through the optical layer 200 in order to connect the second zone 113, 223 of the first and the second emission module 110, 120, as illustrated in FIG. 4M.

In this third embodiment, the heat-dissipating semiconducting layer 310 is formed by the second semiconductor support and has to have necessarily a contact, not illustrated, in order to provide the ground connection to the first zone 111 of the first emission module 110. This ground contact can be provided, as it is the case for the hybrid semiconductor laser component 1 according to the first embodiment, by steps, not illustrated, of thinning the heat-dissipating semiconductor layer 310 and depositing a first metal layer 321. Of course, it is also contemplatable to directly deposit such a first metal layer in contact with the heat-dissipating semiconducting layer 310 without a prior thinning step, or even by providing a simple contact bump in contact with the heat-dissipating semiconducting layer 310.

It could be noted that, of course, it is quite contemplatable to combine the second and third embodiments, without departing from the scope of the invention. A hybrid laser component 1 according to this possibility:

does not include a common ground but has an independent ground contact for each of the emission modules 110, 120 in accordance with the third embodiment, the third and fourth metal layers 323, 324 being divided into several interconnection zones by means of insulating barriers, has, in accordance with the third embodiment, a configuration adapted to provide an adiabatic optical coupling between each emission module 110, 120 and the corresponding wave guide 210, 220 by mode transformation.

Figure 5:
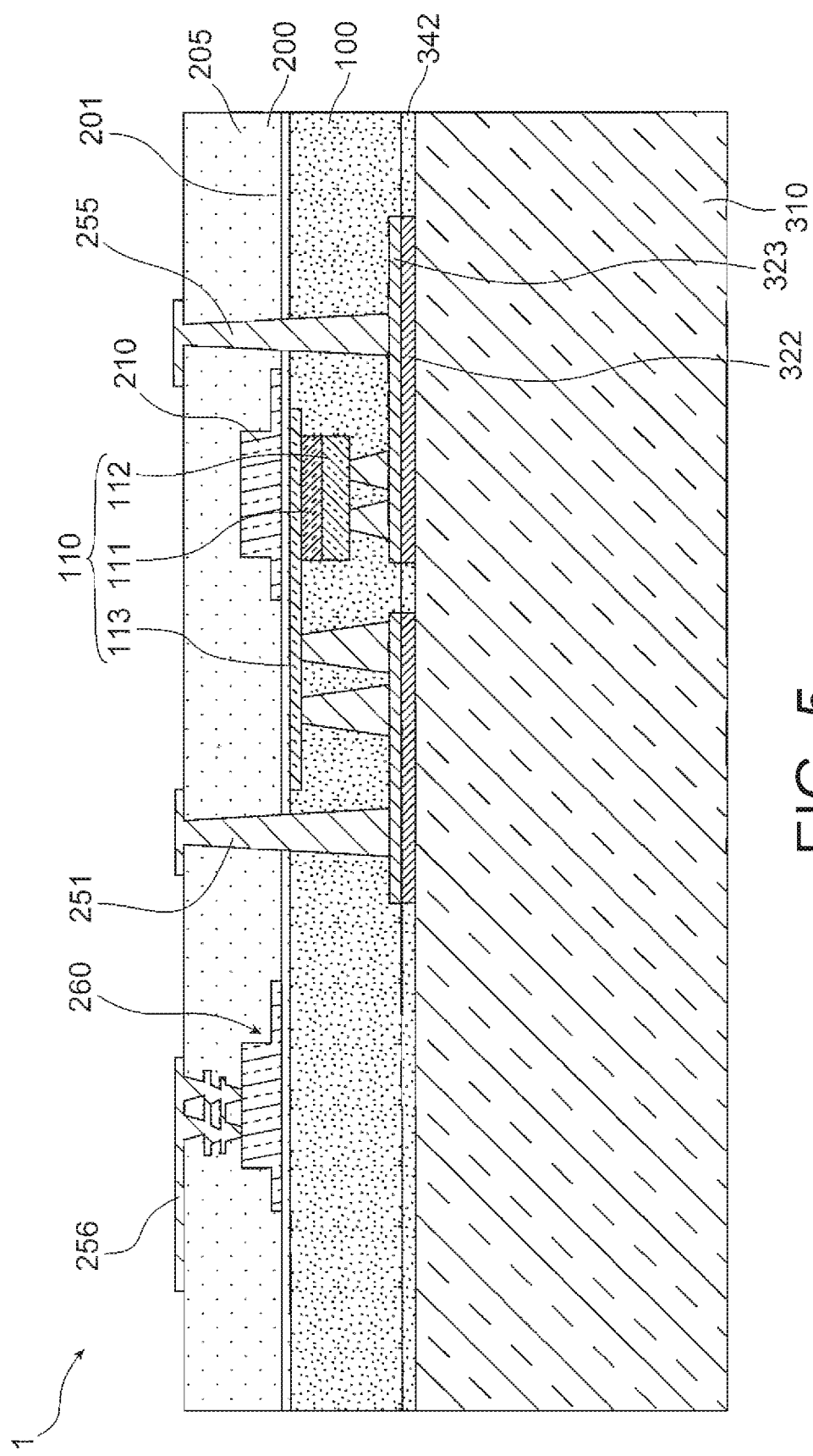

FIG. 5 illustrates a hybrid semiconductor laser component according to a fourth embodiment in which the first and fifth interconnections 251, 255 of the emission module are brought back on portions of the second and third metal layers 322, 323 in contact with the heat-dissipating semiconducting layer 310 to be then returned towards the optical layer 200 by passing through it.

A hybrid semiconductor laser component according to this fourth embodiment differs from a hybrid semiconductor laser component according to the second embodiment in that it only includes a single emission module 210, in that the third semiconducting zone 113 has an extension extending along the optical layer in order to allow an offset contacting relative to the first interconnection 251 and in that the first interconnection 251 has a different configuration.

It will also be noted that a semiconducting active component 260, such as a modulator, and an interconnection 256 are shown in FIG. 5 in order to illustrate the possibility to house active components in the optical layer 200.

Thus, as shown in FIG. 5, the first and third semiconducting zones 112, 113 of the first module 110 are polarised by means of the first and the fifth interconnection 251, 255. Each of the first and the fifth interconnection 251, 255 has:

a first interconnection portion extending towards the heat-dissipating semiconducting layer 310, a respective portion of the second and third metal layers 322, 323, said metal layers being in contact with the dissipation layer, a second interconnection portion extending towards the optical layer by passing through it and by opening through the filling material 205 to be flush with it in order to allow a connection with the control electronics.

In this fourth embodiment, in order to avoid any short-circuit between the first and the third semiconducting zone 112, 113, the portions of the heat-dissipating semiconducting layer are preferentially non-intentionally doped, or even low doped, and the portions of the second and third metal layers respectively corresponding to the first and second interconnections are spaced from each other by an adapted distance such that the heat-dissipating semiconducting layer has a sufficient resistance to electrically insulate them. In a conventional configuration, this distance can be higher than 15 µm, or even 30 µm or even 50 µm.

In this fourth embodiment, the fifth interconnection 255 participates in the thermal contact between the first emission module 110 and the heat-dissipating semiconducting layer 310.

The method for manufacturing a hybrid semiconductor laser component 1 according to this fourth embodiment differs from a manufacturing method according to the first embodiment in that:

during the step of providing the optical layer, the interconnection 256 of the active component 260 is formed, after the step of encapsulating the first emission module in an insulating material, part of the first and fifth interconnections 251, 255, and the portions of the second metal layer 322 are formed, during the step of metal molecular bonding, the third metal layer 323 has the portions corresponding to those of the second metal layer 322.

Figure 6:
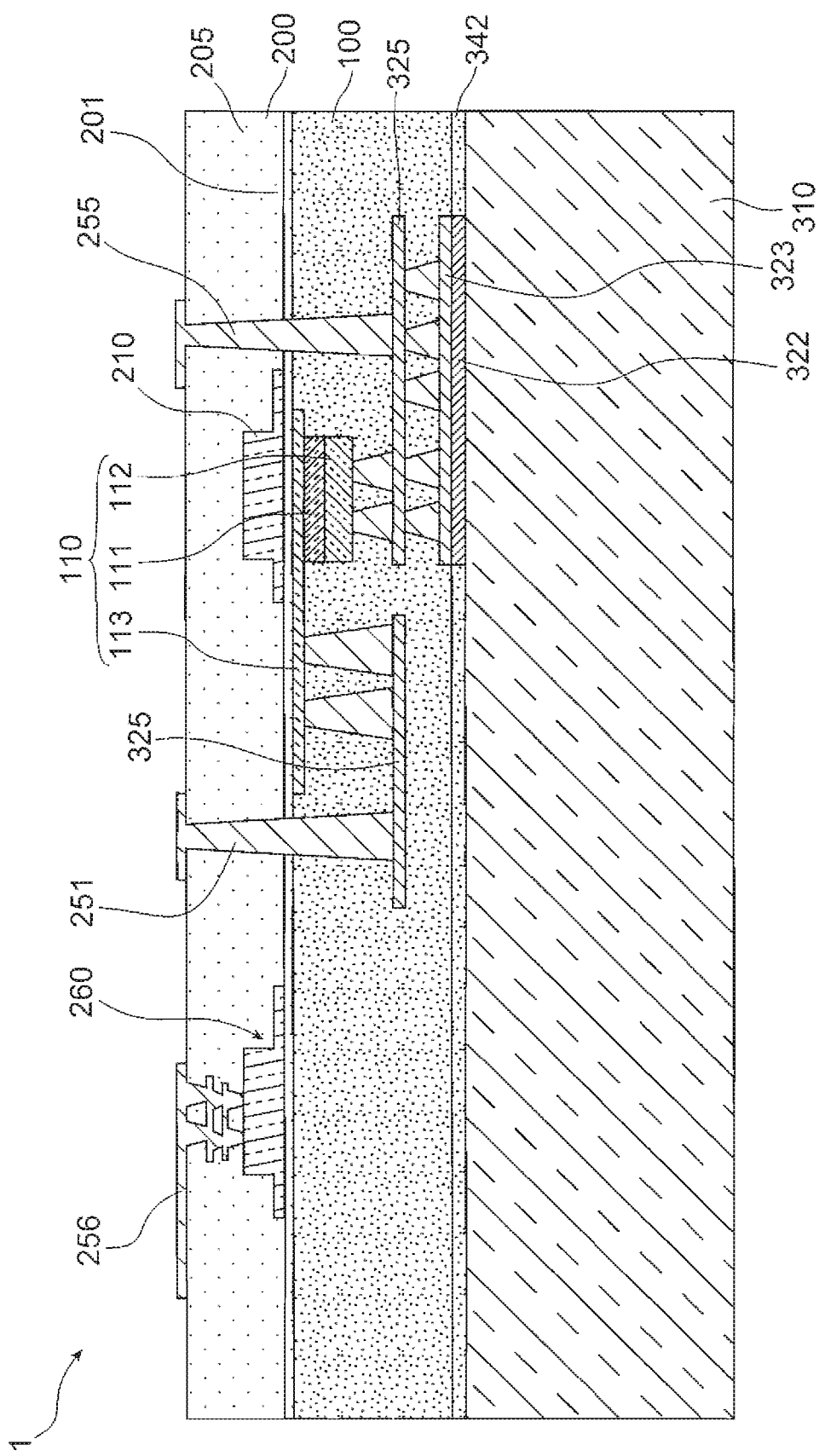

FIG. 6 illustrates a hybrid semiconductor laser component 1 according to a fifth embodiment in which the first and the fifth interconnection 251, 255 of the first emission module have a return on a first intermediate interconnection level to the second and the third metal layer.

A hybrid semiconductor laser component 1 according to this fifth embodiment differs from a component according to the fourth embodiment in that the first and the fifth interconnection of the emission module have a return on a first intermediate interconnection level, the fifth interconnection 255 being extended to the second metal layer in order to provide the thermal contact between the first emission module 110 and the heat-dissipating semiconducting layer.

Thus in this fifth embodiment, the return of the first and the fifth interconnection 251, 255 is made at a fourth metal layer 325, that is a first interconnection level, according to a principle similar to that of the fourth embodiment and the second interconnection has, between the fourth metal layer 325 and the second metal layer, metal vias on a second interconnection level. Such metal vias participate in providing heat conduction between the first emission module and the heat-dissipating layer.

A manufacturing method according to this fifth embodiment differs from the manufacturing method according to the fourth embodiment in that during the step of forming the rest of the first and of the fifth interconnection 251, 255, the fourth metal layer and the vias of the fifth interconnection 255 are formed, in order to provide respectively, the return of the first and the fifth interconnection 251, 255, and the thermal contact between the first emission module 110 and the heat-dissipating semiconducting layer 310.

Figure 7A:
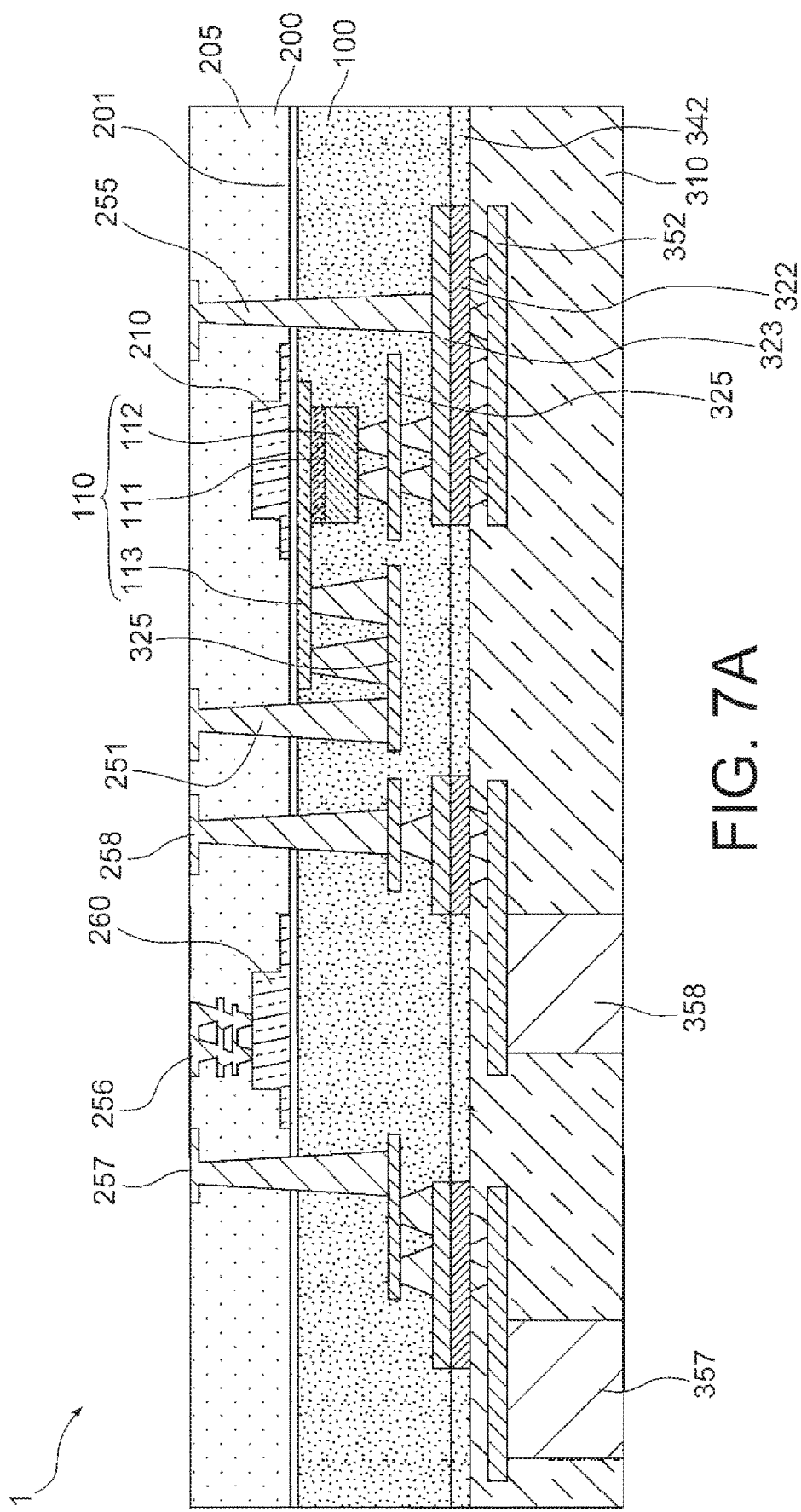
Figure 7B:
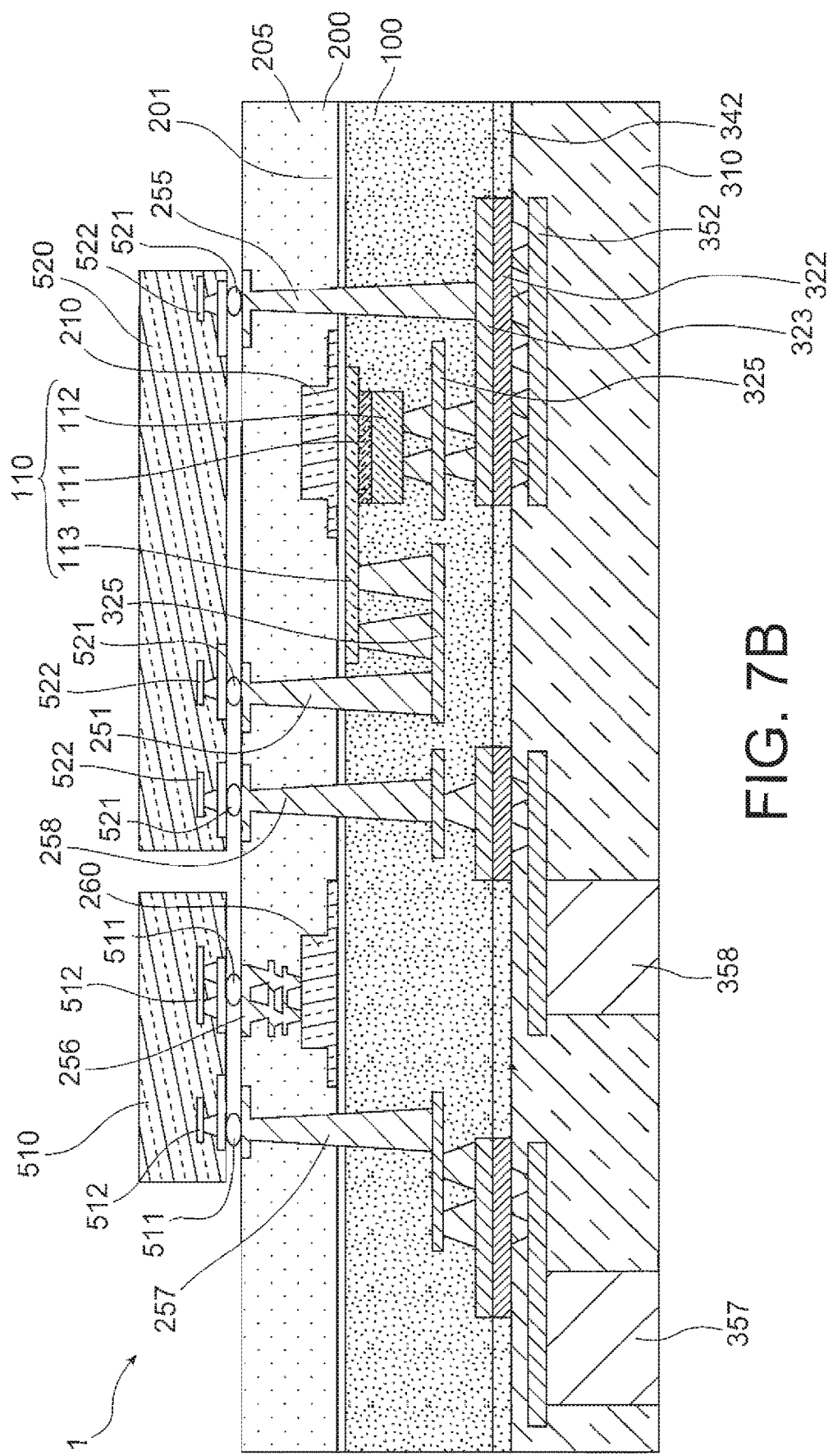

FIGS. 7A and 7B illustrate a hybrid semiconductor laser component 1 according to a sixth embodiment in which sixth and seventh through interconnection 257, 357, 258, 358 are provided between an outer face of the filling material 205 and an outer face of the heat-dissipating semiconducting layer 310. Such a hybrid semiconductor laser component 1 according to this sixth embodiment differs from a hybrid semiconductor laser component 1 according to the fifth embodiment in that the through interconnections 257, 357, 258, 358 are provided.

As shown in FIG. 7A, the component further includes, in addition to the first and fifth interconnections 251, 255 and the interconnection 256, a sixth and seventh through interconnections 257, 357, 258, 358 communicating the outer face of the filling material 205 and the outer face of the heat-dissipating semiconducting layer 310. Thus, the sixth and seventh through interconnections 257, 357, 258, 358 each include:
- a first interconnection portion 257, 258 extending through the filling material 205, the optical layer 200 and the encapsulation layer 100, said first interconnection portion 257, 258 being provided at the outer face of the filling material 205 with a respective contact bump,
- a respective portion of the second and third metal layers 322, 323, said metal layers being in contact with the heat-dissipating semiconducting layer 310,
- a second interconnection portion 357, 358 extending through the heat-dissipating semiconducting layer 310 and opening into the outer face of the heat-dissipating semiconducting layer 310 as a contact bump.

Thus, according to a principle similar to the previous embodiments and as illustrated in FIG. 7B, it is possible to connect control modules 510, 520 of the control electronics to the emission module 110 and to the active component 260 by means of the respective contact bumps of the first and fifth interconnections 251, 255 and of the interconnection 256. Such a connection can be made, for example and as illustrated in FIG. 7B, by copper ball hybridisation 511, 512. These same control modules 510, 520 are, according to the principle of this sixth embodiment, themselves connected to the sixth and seventh through interconnections 257, 357, 258, 358 by means of the connection bumps thereof which are located at the outer surface of the filling material 205. This connection can be made, for example, by copper ball hybridisation. In this way, the connection bumps of the second interconnection portions 357, 358 which are an extension of the sixth and seventh interconnections at the outer surface of the heat-dissipating semiconducting layer 310 provide an external connection of the control modules which is accessible on the heat-dissipating semiconducting layer 310 on a face thereof which is opposite to the optical layer 200.

Of course, in this sixth embodiment in the same way as in the fourth embodiment, in order to avoid any short-circuit between the sixth and seventh through interconnections 257, 357, 258, 358, the heat-dissipating semiconducting layer 310 is preferentially non-intentionally doped, or even low doped, and the portions of the second and of the third metal layer respectively corresponding to the sixth and seventh through interconnections 257, 357, 258, 358 are spaced apart from each other by an adapted distance such that the heat-dissipating semiconducting layer 310 has a sufficient resistance to electrically insulate them. In a conventional configuration, this distance can be higher than 15 µm, or even 30 µm or even 50 µm.

It can also be noted that according to a possibility of this sixth embodiment, the fifth interconnection 255 includes an interconnection line provided in the dissipation layer. Such an interconnection line provided by a fifth metal layer enables the contact surface between the fifth interconnection 255 and the heat-dissipating semiconducting layer to be optimised.

A method for manufacturing a component differs from a method for manufacturing a component according to the fifth embodiment in that during providing the heat-dissipating semiconducting layer 310, the heat-dissipating semiconducting layer 310 is provided with the second interconnection portions 357, 358 and in that the respective portions of the second and third metal layers 322, 323 of the sixth and seventh through interconnections 257, 357, 258, 358 are formed in said second and third metal layers.

Of course, if in the practical applications of the six embodiments described above, each of the emission modules has a first and a second zone of indium phosphorus, the invention is compatible with other types of emission module, as long as they are provided with active zones made of direct-gap semiconductor materials, such as semiconductors III-V, and shaped to emit an electromagnetic radiation at a given wavelength. Thus, it is quite contemplatable that an emission module has, for example, a first and a second zone of indium arsenide. It is also contemplatable that the active zone is a zone comprising quantum dots, or even a single non-intentionally doped zone, without departing from the scope of the invention.

In the same way, if in the six embodiments described above, the hybrid laser components 1 are hybrid laser components in connection with an optical layer of photonic systems not supported by a semiconductor support, the hybrid laser components according to the invention are compatible with an optical layer supported by a semiconductor support. Thus, a hybrid semiconductor laser component according to the invention can be quite integrated to a support which is not adapted, such as a silicon support or a photonic system provided with a semiconductor support.

It will be noted that according to the principle of the invention, in all the embodiments described above, at least part of the contacts of the first and second emission modules 110, 120 and all the active optical components housed in the optical layer 200 are offset on a face opposite to the heat-dissipating layer. Thus, it is possible to optimise heat-dissipating of the component without disturbing the connection of the component to the control electronics.

What is claimed is:
1. A hybrid semiconductor laser component including:
   at least one first emission module comprising an active zone made of direct-gap semiconductor materials and shaped to emit an electromagnetic radiation at a first given wavelength,
   an optical layer comprising at least one first wave guide optically coupled to the active zone of the at least one first emission module, the first wave guide forming with the active zone an optical cavity resonating at the first given wavelength, the hybrid semiconductor laser further including:

a semiconducting layer, called heat-dissipating semiconducting layer, said heat-dissipating semiconducting layer being in thermal contact with the first emission module on a surface of the first emission module which is opposite to the optical layer, at least one first interconnection to connect the at least one first emission module, said first interconnection passing through the optical layer.

2. The hybrid semiconductor laser component according to claim 1, wherein the hybrid semiconductor laser component further comprises a second interconnection to connect the at least one first emission module, the second interconnection being in electrical contact with the heat-dissipating semiconducting layer.

3. The hybrid semiconductor laser component according to claim 2 further comprising:

at least one active component, said active component being housed in the optical layer, at least one third interconnection to connect the active component, said third interconnection extending between the active component and a face of the hybrid semiconductor laser component which is opposite to the heat-dissipating semiconducting layer.

4. The hybrid semiconductor laser component according to claim 3, wherein the component further comprises at least one fourth interconnection, called through fourth interconnection, said fourth interconnection extending between a face of the hybrid semiconductor laser component which is opposite to the heat-dissipating semiconducting layer and a face of the heat-dissipating semiconducting layer which is opposite to the optical layer, and wherein said fourth interconnection has on each of said face of the hybrid semiconductor laser component and of said face of the semiconducting layer, a respective contact bump.

5. The hybrid semiconductor laser component according to claim 1, wherein the hybrid semiconductor laser component further comprises a second interconnection to connect the at least one first emission module, said second interconnection passing through the optical layer.

6. The hybrid semiconductor laser component according to claim 5, the second interconnection comprising:

a first interconnection portion extending towards the heat-dissipating layer, a metal layer portion extending substantially parallel to the heat-dissipating semiconducting layer, said portion being in electrical contact with the first interconnection portion, a second interconnection portion extending in a direction opposite to the heat-dissipating layer and passing through the optical layer, said second interconnection portion being in electrical contact with the metal layer portion.

7. The hybrid semiconductor laser component according to claim 5 further comprising:

at least one active component, said active component being housed in the optical layer, at least one third interconnection to connect the active component, said third interconnection extending between the active component and a face of the hybrid semiconductor laser component which is opposite to the heat-dissipating semiconducting layer.

8. The hybrid semiconductor laser component according to claim 7, wherein the component further comprises at least one fourth interconnection, called through fourth interconnection, said fourth interconnection extending between a face of the hybrid semiconductor laser component which is opposite to the heat-dissipating semiconducting layer and a face of the heat-dissipating semiconducting layer which is opposite to the optical layer, and wherein said fourth interconnection has on each of said face of the hybrid semiconductor laser component and of said face of the semiconducting layer, a respective contact bump.

9. The hybrid semiconductor laser component according to claim 1, wherein the heat-dissipating semiconducting layer is a silicon layer.

10. The hybrid semiconductor laser component according to claim 1, further including at least one first metal layer in contact with the heat-dissipating semiconducting layer on a face of the heat-dissipating semiconducting layer which is opposite to the first emission module.

11. The hybrid semiconductor laser component according to claim 10, further comprising at least one second metal layer in electrical contact with the first emission module on the face of the first emission module which is opposite to the optical layer, and wherein the second metal layer participates in the thermal contact between the heat-dissipating semiconducting layer and the first emission module.

12. The hybrid semiconductor laser component according to claim 11, wherein the heat-dissipating semiconducting layer is in electrical contact with the second metal layer.

13. The hybrid semiconductor laser component according to claim 11, wherein between the second metal layer and the heat-dissipating semiconducting layer, at least one electrically insulating layer shaped to electrically insulate the second metal layer from the heat-dissipating semiconducting layer is provided, the electrically insulating layer participating in the thermal contact between the heat-dissipating semiconducting layer and the first emission module.

14. The hybrid semiconductor laser component according to claim 1, wherein the first emission module is included in an encapsulation layer made of an insulator material.

15. The hybrid semiconductor laser component according to claim 1, further comprising at least one second emission module comprising an active zone made of direct-gap semiconductor materials and shaped to emit an electromagnetic radiation at a second given wavelength different from or identical to the first given wavelength, wherein the optical layer further comprises at least one second wave guide optically coupled to the active zone of the second emission module, said first wave guide forming with the active zone an optical cavity resonating at the second given wavelength, and wherein the heat-dissipating semiconducting layer is in thermal contact with the second emission module on a surface of the second emission module which is opposite to the optical layer.

16. A method for manufacturing a hybrid semiconductor laser, including providing an optical layer including at least one first wave guide, providing at least one first emission module comprising an active zone made of direct-gap semiconductor materials and shaped to emit an electromagnetic radiation at a first given wavelength, the active zone being optically coupled with the first wave guide and forming with the first wave guide an optical cavity resonating at the given wavelength, the manufacturing method further includes:

providing a semiconducting layer, called heat-dissipating semiconducting layer, said heat-dissipating semiconducting layer being in thermal contact with the first emission module on a surface of the first emission module which is opposite to the optical layer, wherein a step of forming at least one first interconnection to connect the at least first emission module is provided, said first interconnection extending by passing through the optical layer.

17. The manufacturing method according to claim 16, wherein the providing a heat-dissipating semiconducting layer includes:

forming at least one second metal layer in thermal contact with the first emission module on the surface of the first emission module which is opposite to the optical layer, forming another metal layer in thermal contact with the heat-dissipating semiconducting layer, performing a metal molecular bonding of the metal layer with the another metal layer so as to put the surface of the first emission module which is opposite to the optical layer and the heat-dissipating semiconducting layer into thermal contact.

18. The manufacturing method according to claim 17, wherein during the providing the heat-dissipating semiconducting layer, between the providing the heat-dissipating semiconducting layer and the forming the another metal layer, it is performed:

forming at least one electrically insulating layer in thermal contact with the heat-dissipating semiconducting layer, wherein the electrically insulating layer being shaped to electrically insulate the metal layer of the heat-dissipating semiconducting layer, the electrically insulating layer participating in the thermal contact between the heat-dissipating semiconducting layer and the first emission module.

19. The manufacturing method according to claim 16, wherein during the providing the optical layer, the optical layer includes at least one second wave guide, wherein during the providing the at least one first emission module, a second emission module is also provided, the second emission module comprising an active zone made of direct-gap semiconductor materials and shaped to emit an electromagnetic radiation at a second given wavelength different from or identical to the first given wavelength, and wherein during the providing the heat-dissipating semiconducting layer, said heat-dissipating semiconducting layer is also in thermal contact with the second emission module on a surface of the second emission module which is opposite to the optical layer.

\* \* \* \* \*